(12) United States Patent
Devarajan et al.

(10) Patent No.: US 10,250,250 B2
(45) Date of Patent: Apr. 2, 2019

(54) BOOTSTRAPPED SWITCHING CIRCUIT

(71) Applicant: Analog Devices, Inc., Norwood, MA (US)

(72) Inventors: Siddharth Devarajan, Arlington, MA (US); Lawrence A. Singer, Bedford, MA (US)

(73) Assignee: ANALOG DEVICES, INC., Norwood, MA (US)

( * ) Notice: Subject to any disclaimer, the term of this patent is extended or adjusted under 35 U.S.C. 154(b) by 0 days.

(21) Appl. No.: 15/689,491

(22) Filed: Aug. 29, 2017

(65) Prior Publication Data

US 2018/0076807 A1  Mar. 15, 2018

Related U.S. Application Data

(60) Provisional application No. 62/393,529, filed on Sep. 12, 2016.

(51) Int. Cl.
| | |
|---|---|
| *H03K 17/06* | (2006.01) |
| *H03K 17/0412* | (2006.01) |
| *H03M 1/18* | (2006.01) |
| *H03K 17/042* | (2006.01) |
| *H03K 17/00* | (2006.01) |
| *H03K 19/0185* | (2006.01) |
| *H03K 19/017* | (2006.01) |
| *H03M 1/06* | (2006.01) |
| *H03M 1/12* | (2006.01) |

(52) U.S. Cl.
CPC ..... *H03K 17/04206* (2013.01); *H03K 17/005* (2013.01); *H03K 17/04123* (2013.01); *H03K 17/063* (2013.01); *H03K 19/017* (2013.01); *H03K 19/018521* (2013.01); *H03M 1/0607* (2013.01); *H03M 1/1245* (2013.01); *H03M 1/183* (2013.01)

(58) Field of Classification Search
CPC .......... H03K 17/04123; H03K 17/063; H03M 1/183
See application file for complete search history.

(56) References Cited

U.S. PATENT DOCUMENTS

| | | | |
|---|---|---|---|
| 5,945,872 A | 8/1999 | Robertson et al. | |
| 6,060,937 A * | 5/2000 | Singer .................. | H03K 17/063 327/390 |
| 6,118,326 A * | 9/2000 | Singer .............. | H03K 19/01735 327/390 |

(Continued)

OTHER PUBLICATIONS

Siddharth Devarajan et al., *A 16b 125MS/s 385mW 78.7d SNR CMOS Pipeline ADC*, ISSCC 2009, Session 4, High-Speed Data Converters, 4.7, 3 pages.

(Continued)

*Primary Examiner* — Kenneth B Wells
(74) *Attorney, Agent, or Firm* — Patent Capital Group

(57) ABSTRACT

The trend in wireless communication receivers is to capture more and more bandwidth to support higher throughput, and to directly sample the radio frequency (RF) signal to enable re-configurability and lower cost. Other applications like instrumentation also demand the ability to digitize wide bandwidth RF signals. These applications benefit from input circuitry which can perform well with high speed, wide bandwidth RF signals. An input buffer and bootstrapped switch are designed to service such applications, and can be implemented in 28 nm complementary metal-oxide (CMOS) technology.

22 Claims, 8 Drawing Sheets

(56) References Cited

U.S. PATENT DOCUMENTS

| | | | | |
|---|---|---|---|---|
| 7,253,675 | B2* | 8/2007 | Aksin | G11C 27/024 327/390 |
| 7,397,284 | B1* | 7/2008 | Liu | H03K 5/2481 326/82 |
| 7,863,943 | B2 | 1/2011 | Maes et al. | |
| 7,940,091 | B1* | 5/2011 | Govindarajulu | G11C 27/02 327/390 |
| 2013/0009797 | A1 | 1/2013 | Grilo et al. | |
| 2014/0266392 | A1 | 9/2014 | Devarajan et al. | |

OTHER PUBLICATIONS

Jiangfeng Wu et al., *A 5.4GS/s 12b 500mW Pipeline ADC in 28nm CMOS*, 2013 Symposium on VLSI Circuits Digest of Technical Papers, 978-4-86348-348-4, 2 pages.

Ahmed M.A. Ali et al., *A 14 Bit 1 GS/s RF Sampling Pipelined ADC with Background Calibration*, IEEE Journal of Solid-State Circuits, vol. 49, No. 12, Dec. 2014, 11 pages.

Massimo Brandolini et al., *A 5GS/s 150mW 10b SHA-Less Pipelined/ SAR Hybrid ADC in 28nm CMOS*, ISSCC 2015, Session 26, Nyquist-Rate Converters, 26.6, 3 pages.

Matt Straayer et al., *A 4GS/s Time-Interleaved RF ADC in 65 nm CMOS with 4GHz Input Bandwidth*, ISSCC 2016, Session 27, Hybrid and Nyquist Data Converters, 27.5, 3 pages.

Jiangfeng Wu et al., *A 4GS/s 13b Pipelined ADC with Capacitor and Amplifier Sharing in 16 nm CMOS*, ISSCC 2016, Session 27, Hybrid and Nyquist Data Converters, 27.6, 3 pages.

Ahmed M.A. Ali et al., *A 14-bit 2.5GS/s and 5GS/s Sampling ADC with Background Calibration and Dither*, 2016 Symposium on VLSI Circuits Digest of Technical Papers, 978-1-5090-0635-9/16, 2 pages.

Siddharth Devarajan et al., *A 12b 10GS/s Interleaved Pipeline ADC in 28nm CMOS Technology*, ISSCC 2017, Session 16, Gigahertz Data Converters, 16.7, 3 pages.

Todd L. Brooks et al., *A Cascaded Sigma-Delta Pipeline A/D Converter with 1.25 MHz Signal Bandwidth and 89 dB SNR*, IEEE Journal of Solid-State Circuits, vol. 32, No. 12, Dec. 1997, 11 pages.

Andrew M. Abo et al., *A 1.5-V, 10-bit, 14.3-MS/s CMOS Pipeline Analog-to-Digital Converter*, IEEE Journal of Solid-State Circuits, vol. 34, No. 5, May 1999, 8 pages.

Eric Siragusa et al., *A Digitally Enhanced 1.8-V 15-bit 40-MSample/s CMOS Pipelined ADC*, IEEE Journal of Solid-State Circuits, vol. 39, No. 12, Dec. 2004, 13 pages.

* cited by examiner

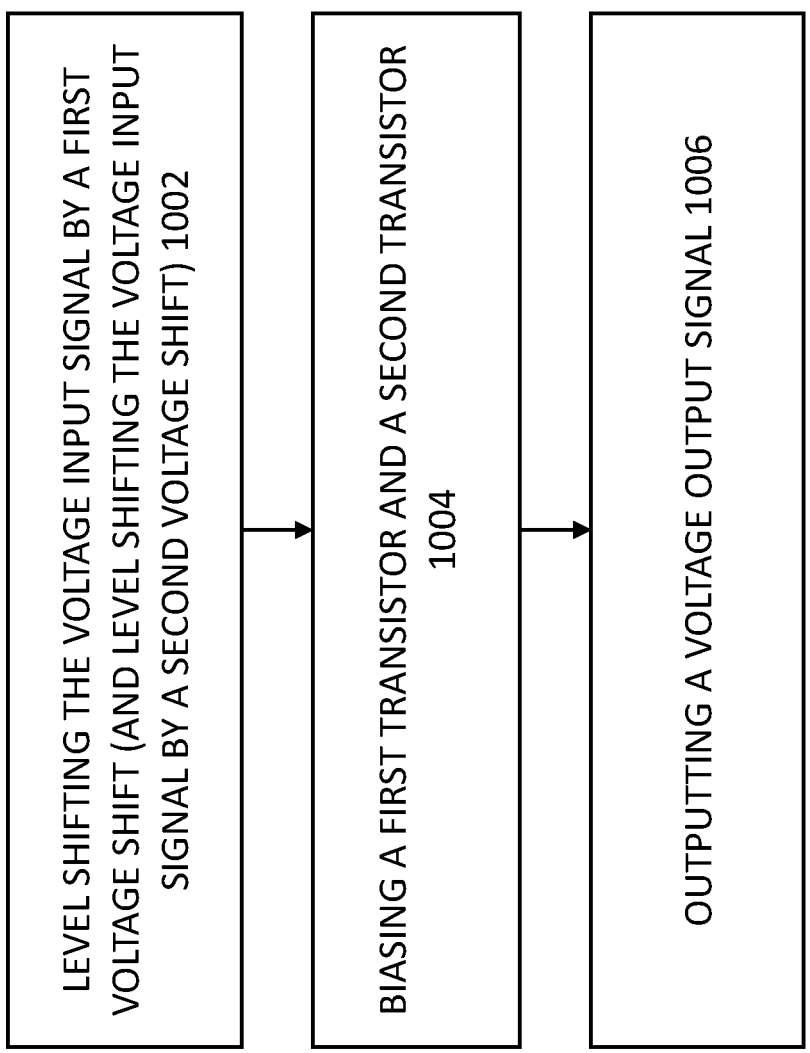

BOOTSTRAPPED SWITCHING CIRCUIT

PRIORITY DATA AND RELATED APPLICATIONS

This patent application receives benefit from and/or claim priority to U.S. Provisional Patent Application Ser. No. 62/393,529, filed on Sep. 12, 2016, entitled "INPUT BUFFER AND BOOTSTRAPPED SWITCHING CIRCUIT". This U.S. Provisional Patent Application is incorporated by reference in its entirety.

TECHNICAL FIELD OF THE DISCLOSURE

The present disclosure relates to the field of integrated circuits, in particular to input circuitry for analog-to-digital converters (ADCs).

BACKGROUND

In many electronics applications, an analog-to-digital converter (ADC) converts an analog input signal to a digital output signal, e.g., for further digital signal processing or storage by digital electronics. Broadly speaking, ADCs can translate analog electrical signals representing real-world phenomenon, e.g., light, sound, temperature, electromagnetic waves, or pressure for data processing purposes. For instance, in measurement systems, a sensor makes measurements and generates an analog signal. The analog signal would then be provided to an analog-to-digital converter (ADC) as input to generate a digital output signal for further processing. In another instance, a transmitter generates an analog signal using electromagnetic waves to carry information in the air or a transmitter transmits an analog signal to carry information over a cable. The analog signal is then provided as input to an ADC at a receiver to generate a digital output signal, e.g., for further processing by digital electronics.

Due to their wide applicability in many applications, ADCs can be found in places such as broadband communication systems, audio systems, receiver systems, etc. Designing circuitry in ADC is a non-trivial task because each application may have different needs in performance, power, cost, and size. ADCs are used in a broad range of applications including Communications, Energy, Healthcare, Instrumentation and Measurement, Motor and Power Control, Industrial Automation and Aerospace/Defense. As the applications needing ADCs grow, the need for fast yet accurate conversion also grows.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which:

FIG. 10 is a flow diagram for buffering an input signal, according to some embodiments of the disclosure.

DESCRIPTION OF EXAMPLE EMBODIMENTS OF THE DISCLOSURE

Overview

The trend in wireless communication receivers is to capture more and more bandwidth to support higher throughput, and to directly sample the radio frequency (RF) signal to enable re-configurability and lower cost. Other applications like instrumentation also demand the ability to digitize wide bandwidth RF signals. These applications benefit from input circuitry which can perform well with high speed, wide bandwidth RF signals. An input buffer and bootstrapped switch are designed to service such applications, and can be implemented in 28 nm complementary metal-oxide (CMOS) technology.

High Speed Analog-to-Digital Converters

ADCs are electronic devices that convert a continuous physical quantity carried by an analog signal to a digital output or number that represents the quantity's amplitude (or to a digital signal carrying that digital number). An ADC can be defined by the following application requirements: its bandwidth (the range of frequencies of analog signals it can properly convert to a digital signal) and its resolution (the number of discrete levels the maximum analog signal can be divided into and represented in the digital signal). An ADC also has various specifications for quantifying ADC dynamic performance, including signal-to-noise-and-distortion ratio SINAD, effective number of bits ENOB, signal to noise ratio SNR, total harmonic distortion THD, total harmonic distortion plus noise THD+N, and spurious free dynamic range SFDR. Analog-to-digital converters (ADCs) have many different designs, which can be chosen based on the application requirements and specifications.

High speed applications are particularly important in communications and instrumentation. The input signal can have a frequency in the gigahertz range, and the ADC may need to sample in the range of Giga-samples per second. High frequency input signals can impose many requirements on the circuits receiving the input signal, i.e., the "front end" circuitry of the ADC. The circuit not only has to be fast, for some applications, the circuit needs to meet certain performance requirements, such as SNR and SFDR. Designing an ADC that meets both speed and performance requirements is not trivial.

Figure 1:
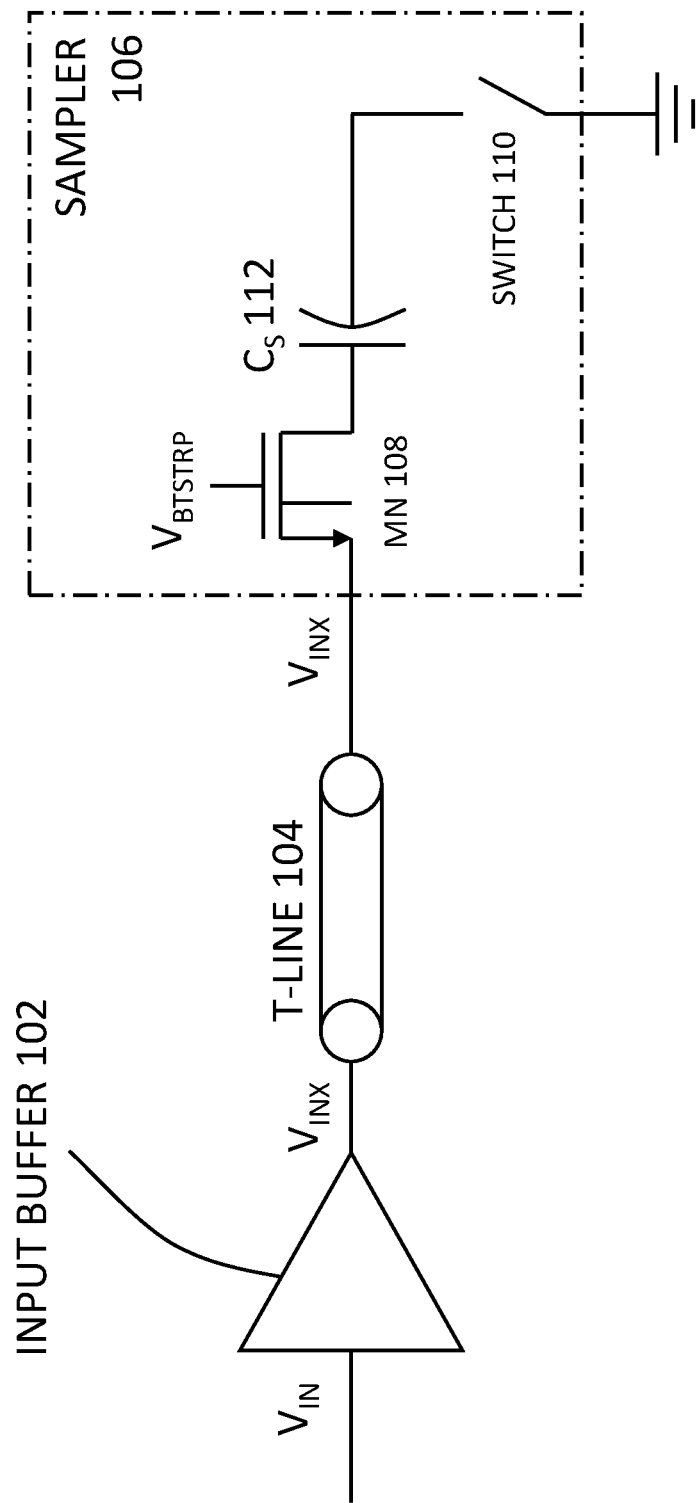
FIG. 1 shows a front end to an analog-to-digital converter, according to some embodiments of the disclosure.

FIG. 1 shows a front end to an analog-to-digital converter, according to some embodiments of the disclosure. Typically, an input signal VIN (e.g., a high frequency input signal in the gigahertz range) is provided to an input buffer 102. The output VINX of the input buffer is then provided to a sampler 106 where the input signal, in the form of VINX from the output of the input buffer, is sampled onto a sampling capacitor CS112.

A transistor MN 108 (e.g., an N-type complementary metal-oxide field-effect (CMOS) transistor, or NMOS transistor) is provided to allow the input signal $V_{INX}$ to be provided to the sampling capacitor $C_S$. Transistor MN 108 is sometimes referred to herein as the sampling switch. During sampling, transistor MN 108 is turned on, and switch 110 is closed. The output $V_{INX}$ of the input buffer may pass through a transmission line ("T-LINE") 104 going from the output of the input buffer 102 to the sampler 106. In some cases where the ADC includes a plurality of ADCs in parallel (e.g., where the ADC is a time-interleaved ADC or a randomized time-interleaved ADC), there are multiple (matched) samplers, including sampler 106, in parallel. Multiple (matched) transmission lines can be included to provide the output signal $V_{INX}$ from a common input buffer 102 to each sampler. Time-interleaved ADCS or randomized time-interleaved ADCs can sample the input signal $V_{INX}$ one at a time. In some cases, a reference ADC and one of the time-interleaved ADCs sample the output signal $V_{INX}$ at substantially the same time. For time-interleaved ADCs or randomized time-interleaved ADCs, some of the samplers may be off at any given time while one or more samplers loads the input buffer. To reduce degradation of SFDR, the back gates of the transistors in the samplers coupled to receive the input signal $V_{INX}$ (e.g., transistor MN 108) can be tied to a negative voltage, such as −1 volts, to minimize the non-linearity in those transistors.

Bootstrapped Switching Circuit

Referring back to FIG. 1, the timing of the transistor MN 108 turning on quickly enough to allow $V_{INX}$ to be sampled onto the sampling capacitor $C_S$ 112 is critical, especially for high speed applications. Consider an example where an ADC has a sampling rate of 10 Giga-samples per second, the transistor MN 108 must turn on quickly enough to allow sampling of the input signal $V_{INX}$ onto sampling capacitor Cs 112 with only a hundred picoseconds between samples. The timing for turning on transistor MN 108 can depend on the inherent transistor characteristics of transistor MN 108, and also on the signal $V_{BSTRP}$ driving MN 108 at the gate with respect to the signal $V_{INX}$ at the source. Examples herein are described where signals are referred to as going high or going low, which refers to different logic levels of the signals.

Figure 2:
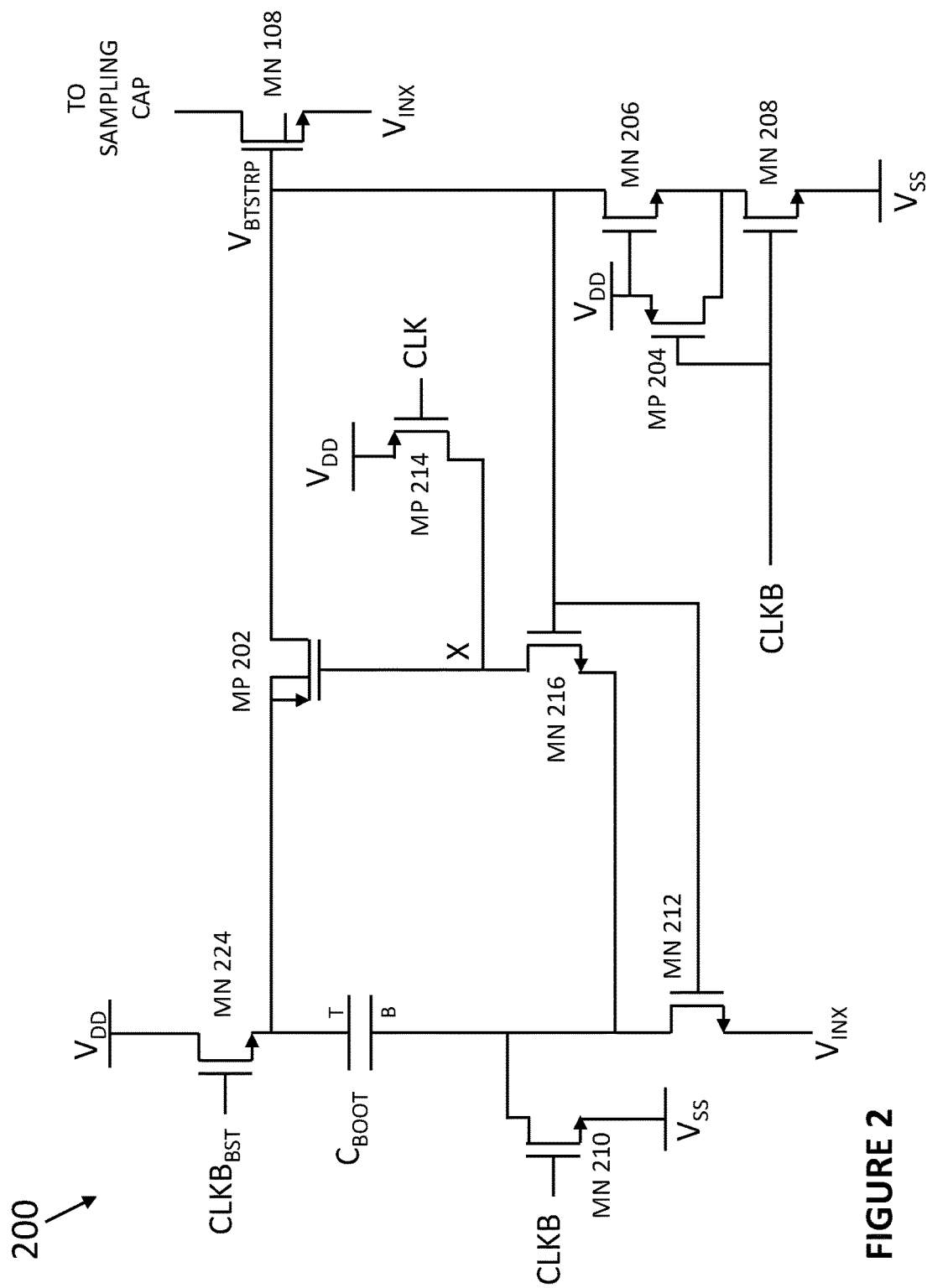
FIG. 2 shows a bootstrapped switching circuit, according to some embodiments of the disclosure.

FIG. 2 shows a bootstrapped switching circuit 200, according to some embodiments of the disclosure. The bootstrapped switching circuit includes the transistor MN 108 from FIG. 1, which receives input signal $V_{INX}$ at its source, and its drain is connected to one plate of sampling capacitor (e.g., sampling capacitor Cs 112 of FIG. 1). The bootstrapped switching circuit also includes a bootstrapped gate voltage generator (circuit) for generating a gate voltage signal $V_{BSTRP}$ driving the gate of transistor MN 108 (the sampling switch). The bootstrapped gate voltage generator generates the gate voltage signal $V_{BSTRP}$ in a manner that ensures the transistor MN 108 is turned on quickly.

The bootstrapped gate voltage generator can receive $V_{INX}$, and include a boot capacitor for generating a boosted voltage of $V_{INX}+V_{BOOT}$. The bootstrapped gate voltage generator has a positive feedback loop. The positive feedback loop takes $V_{INX}$ as input to the positive feedback loop, and the positive feedback loop includes the boot capacitor in the positive feedback loop path. An output of the positive feedback loop generates the gate voltage signal $V_{BSTRP}$ driving the gate of transistor MN 108 (the sampling switch).

The positive feedback loop serves to bring the gate voltage signal $V_{BSTRP}$ high quickly to ensure fast turn on of the transistor MN 108. The positive feedback loop is bootstrapped to the input signal $V_{INX}$, where the goal of the positive feedback loop is to drive gate voltage signal $V_{BSTRP}$ to be $V_{INX}$ plus the voltage $V_{BOOT}$ ($V_{BOOT}$ being the voltage across the boot capacitor $C_{BOOT}$) to turn on transistor MN 108. Specifically, the positive feedback loop drives the gate voltage signal $V_{BSTRP}$ to be high enough to cause sufficient voltage $V_{GS}$ across the gate and the source for transistor MN 108 to turn on. The bootstrapped gate voltage generator is driven by a clock signal CLK, and CLKB being the inverted version of CLK. The bootstrapped gate voltage generator can also receive a charging phase clock signal $CLKB_{BST}$, which controls the timing of a charging phase of the boot capacitor $C_{BOOT}$. The transistor MN 108 is expected to turn on quickly when CLK goes high, and transistor MN 108 is expected to turn off when CLK goes low.

During the charging phase (CLKB and $CLKB_{BST}$ are both high), transistor MN 224 and transistor MN 210 (e.g., NMOS transistors) are turned on to charge a voltage $V_{BOOT}$ across boot capacitor $C_{BOOT}$ (e.g., $V_{BOOT}=V_{DD}-V_{SS}$). Turning transistor MN 224 on connects top plate of capacitor $C_{BOOT}$ to $V_{DD}$. Turning transistor MN 210 on connects the bottom plate of capacitor $C_{BOOT}$ to $V_{SS}$. If $V_{SS}$ is ground, then the boot capacitor $C_{BOOT}$ is charged to $V_{DD}$.

Just before the positive feedback loop is activated, node X was at $V_{DD}$ since CLK was low in the previous phase (charging phase). CLK drives the gate of transistor MP 214 (e.g., a P-type complementary metal-oxide field-effect (CMOS) transistor, or PMOS transistor). CLK being low would make the transistor MP 214 on. When transistor MP 214 was on, the drain of transistor MP 214 (which is node X) was at $V_{DD}$. When node X was at $V_{DD}$ and CLKB was high, transistor MP 202 (e.g., PMOS transistor) is off. Herein, transistor MP 202 can be referred to as the output transistor which outputs $V_{BSTRP}$ driving the gate of transistor MN 108 (the sampling switch). $V_{BSTRP}$ was at a low state, which keeps sample switch, i.e., transistor MN 108 off.

CLK going from low to high (or CLKB goes from high to low) activates the positive feedback loop. When CLKB driving the gate of transistor MP 204 (e.g., PMOS transistor) goes low (i.e., CLK goes high), transistor MP 204 (e.g., PMOS transistor) is turned on, pulling the drain of MN 208 (e.g., NMOS transistor) close to $V_{DD}$ (goes high) and pulling the drain of MN 206 (e.g., NMOS transistor) high (e.g., $V_{DD}$), which in turns makes the $V_{BSTRP}$ node go high. $V_{BSTRP}$ drives the gates of transistors MN 216 (e.g., NMOS transistor) and MN 212 (e.g., NMOS transistor). Transistor MN 212 can be referred to as the input transistor since transistor MN 212 receives the input signal $V_{INX}$. $V_{BSTRP}$ going high can turn on transistor MN 216 (e.g., NMOS transistor) and transistor MN 212 (e.g., NMOS transistor). Meanwhile, transistor MP 214 has been turned off since CLK went high. Effectively, through the on transistors MN 216 and MN 212, the gate of transistor MP 202, i.e., node X, gets tied to $V_{INX}$.

In a previous phase (i.e., the charging phase), boot capacitor $C_{BOOT}$ is charged to have $V_{BOOT}$ across the boot capacitor. When the positive feedback loop is engaged, the gate of transistor MP 202 can have $V_{INX}$, the source of transistor MP 202 can have a voltage of $V_{INX}+V_{BOOT}$. Transistor MP 202 turns on, making $V_{BTSTRP}$ rise to $V_{INX}+V_{BOOT}$, which increases the voltage across the gate and the source $V_{GS}$ (i.e., $V_{BSTRP}-V_{INX}=V_{BOOT}$) of the sampling switch, i.e., transistor MN 108, to turn on. As $V_{BTSTRP}$ rises, the positive feedback of $V_{BTSTRP}$ rising loops through transistors MN 216 and MN 212, which again in turn keeps $V_{BSTRP}$ rising further to turn on transistor MN 108. As a result, the positive feedback loop enables a fast turn on of transistor MN 108.

In some cases, at the startup of the positive feedback loop when the gate of transistor MP 202, i.e., node X, is getting tied to $V_{INX}$, the two transistors MN 216 and MN 212 in the positive feedback loop assisting in the action of bringing node X, can be slow to turn on, which greatly slows down the positive feedback loop when node X does not get tied to $V_{INX}$ quickly enough.

Consider when $V_{INX}$ (i.e., at the source of transistor MN 212) is close to $V_{DD}$ at a particular instant in time, and the gate of transistor MN 216 and the gate of transistor MN 212 (i.e., the $V_{BSTRP}$ node) are also close to $V_{DD}$ as soon as CLKB goes low at the startup (startup meaning CLKB has just become low, or CLK has just become high). Node X is also at $V_{DD}$ at the start up (since CLK was low, and node X is at $V_{DD}$ via transistor MP 214). This scenario can make all terminals of the transistor MN 216 at roughly $V_{DD}$. The transistors MN 216 and MN 212 might not see enough voltage across the gate and the source ($V_{GS}$) of the respective transistors to turn on. Therefore transistors MN 216 and MN 212 would barely/weakly turn on since there is not enough $V_{GS}$, slowing down the positive feedback action of the loop. The loop eventually works as transistors MN 216 and MN 212 turn on more fully to pull node X closer to $V_{INX}$ to turn on transistor MP 202, which serves to allow $V_{INX}+V_{BOOT}$ to pass through transistor MP 202 towards the gate of transistor MN 108 and making $V_{BSTRP}$ rise.

Jumpstarting the Positive Feedback Loop

To address this slowdown of the positive feedback loop, a jump start circuit can be included to quickly turn on transistor MP 202 (the output transistor) at the startup of the positive feedback loop action to allow $V_{INX}+V_{BOOT}$ to pass through transistor MP 202 towards the gate of transistor MN 108 more quickly, causing $V_{BSTRP}$ to rise more quickly, which in turn can turn on transistors MN 216 and MN 212 faster. The result is a much faster bootstrapped switching circuit.

Figure 3:
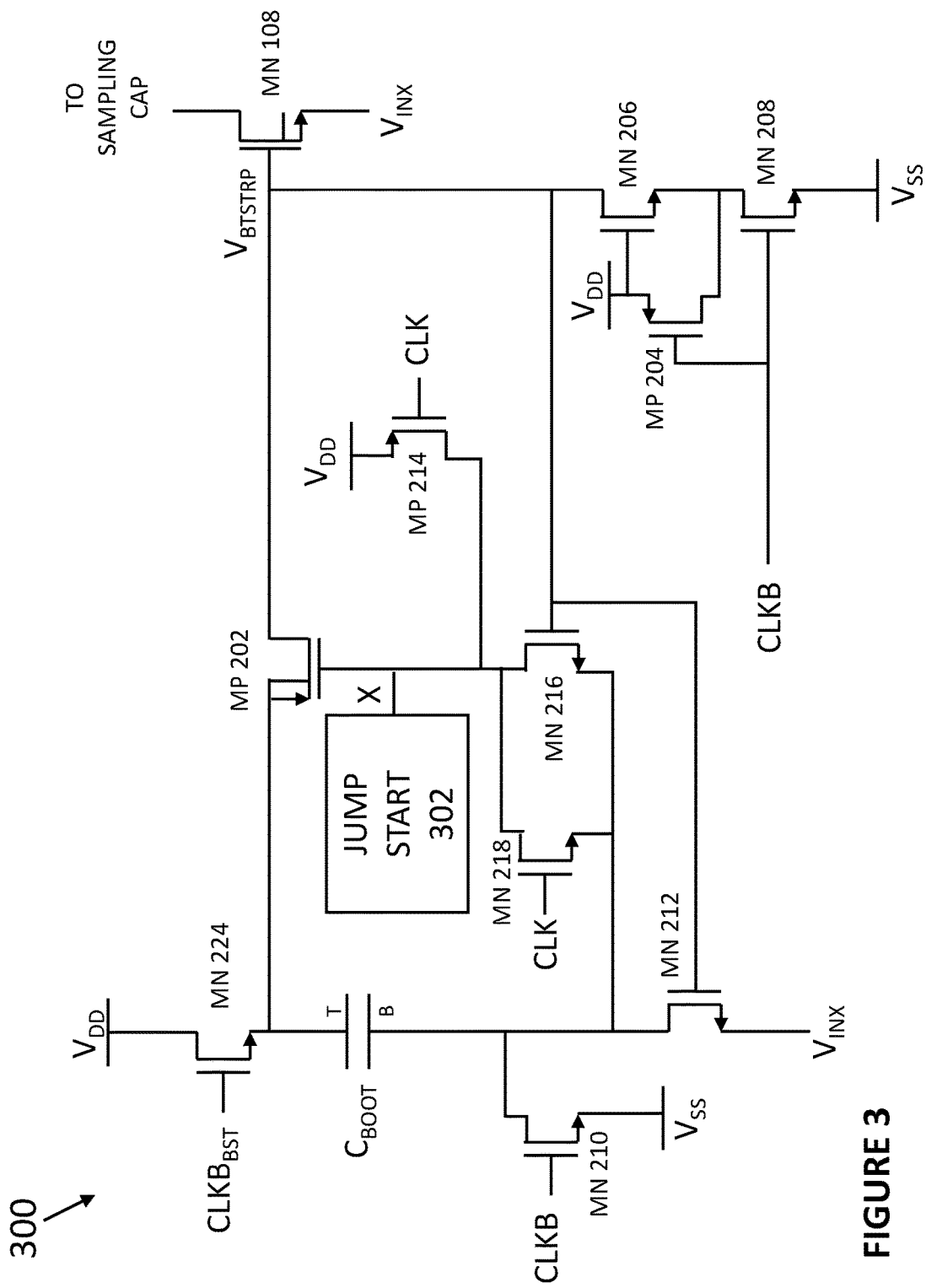
FIG. 3 shows a bootstrapped switching circuit having accelerated turn on, according to some embodiments of the disclosure.

FIG. 3 shows a bootstrapped switching circuit 300 having accelerated turn on, according to some embodiments of the disclosure. The bootstrapped switching circuit 300 has a sampling switch, e.g., transistor MN 108, receiving a voltage input signal, e.g., $V_{INX}$, and a gate voltage, e.g., $V_{BTSTRP}$. The bootstrapped switching circuit also has a bootstrapped voltage generator. The bootstrapped voltage generator generates the gate voltage, e.g., $V_{BTSTRP}$, for the sampling switch.

The bootstrapped switching circuit comprises a positive feedback loop to generate the gate voltage for turning on the sampling switch. The positive feedback loop can include an input transistor, e.g., transistor MN 212, receiving the voltage input signal, e.g., $V_{INX}$, and an output transistor, e.g., transistor MP 202, outputting the gate voltage of the sampling switch. The positive feedback loop comprises a boot capacitor, e.g., $C_{BOOT}$, which can be used to generate a boosted voltage, e.g., $V_{INX}+V_{BOOT}$. Because the sampling switch, e.g., transistor MN 108, has $V_{INX}$ at its source, the boosted voltage being at the gate of the sampling switch would turn on the sampling switch. In other words, the positive feedback loop turns on the sampling switch, e.g., transistor MN 108, by bringing the gate voltage to the boosted voltage generated based on the voltage input signal $V_{INX}$ and the voltage across the boot capacitor $C_{BOOT}$. The input transistor, e.g., source of transistor MN 212, is coupled to a first plate of the boot capacitor. The output transistor, e.g., source of transistor MP 202, is coupled to a second plate of the boot capacitor.

The positive feedback loop operates by using the gate voltage as positive feedback to drive the transistors in the loop, e.g., transistors MN 212 and MN 216. Those transistors in turn bring the gate voltage of the output transistor, e.g., transistor MP 202, to $V_{INX}$ and assists the output transistor, e.g., transistor MP 202, with passing the boosted voltage or bringing the gate voltage to the boosted voltage. The boosted voltage can turn on the sampling switch, e.g., transistor MN 108.

For the exemplary positive feedback loop shown, the input transistor, e.g., transistor MN 212, is driven by the gate voltage $V_{BSTRP}$ of the sampling switch, e.g., transistor MN 108. The positive feedback loop further comprises a first transistor, e.g., transistor MN 216, coupled to the gate of the output transistor, e.g., transistor MP 202, and a drain of the input transistor, e.g., transistor MN 212. The first transistor is also driven by the gate voltage of the sampling switch as well. Together, the first transistor and the input transistor, when turned on, brings node X to VINX during the positive feedback loop action.

The bootstrapped switching circuit also includes a jump start circuit 302 to turn on the output transistor for a limited period of time during which the input transistor is turning on at a startup of the positive feedback loop. The jump start circuit 302 is coupled to node X, e.g., at the gate of transistor MP 202, where transistor MP 202 is the output transistor of the positive feedback loop. In some embodiments, the jump start circuit 302, e.g., provides/outputs a signal at node X, to turn on the transistor MP 202 momentarily when CLKB goes low to jump start the positive feedback loop action. The jump start circuit 302 ceases to turn on the output transistor, e.g., transistor MP 202, after the limited period of time and allows the positive feedback loop to operate.

Phrased differently, the jump start circuit 302 engages the output transistor MP 202 for when the positive feedback loop action begins, and disengages from the output transistor MP 202 so that the positive feedback loop action can engage to drive the output transistor MP 202 (allowing the positive feedback loop action to bring node X to $V_{INX}$). This jump start circuit 302 can help the positive feedback loop move faster during the (short period of) time when transistors MN 216 and MN 212 are slow to turn on. The jump start circuit 302 can jump start the positive feedback loop action by pulling the node X towards a low logic level (e.g., ground or some other bias voltage) momentarily at the gate of transistor MP 202 so that transistor MP 202 turns on to allow $V_{INX}+V_{BOOT}$ (i.e., top plate voltage of the boot capacitor $C_{BOOT}$) to pass through output transistor MP 202 towards the gate of transistor MN 108 more quickly, causing $V_{BSTRP}$ to rise more quickly.

Note that jump start circuit 302 only pulls the node X towards a low logic level momentarily but preferably does not let node X get to ground or a low logic level completely. Pulling node X to ground completely can cause unwanted stress on transistor MP 202, since the source of transistor MP 202 sees $V_{INX}+V_{BOOT}$. Furthermore, the jump start circuit 302 quickly "lets go" of node X (or ceases the pulling of node X towards the low logic level) to allow the positive feedback loop to operate, and preferably "lets go" prior to transistors MN 216 and MN 212 engaging fully to tie node X to $V_{INX}$. The timing of the jump start circuit 302 can vary depending on the implementation.

At the startup of the positive feedback loop, and just prior to CLKB going low, node X is at $V_{DD}$ to keep output transistor MP 202 off when boot capacitor $C_{BOOT}$ is charging and to keep $V_{BSTRTP}$ low. However, when node X starts at $V_{DD}$ at the startup of the positive feedback loop action, node X slows down the feedback mechanism. The jump start circuit 302 quickly turns on transistor MP 202 by pulling node X towards a suitable logic level so that node X starting at $V_{DD}$ no longer impedes the speed of the feedback loop action.

In some cases, an additional transistor MN 218 (e.g., NMOS transistor), with its gate connected to CLK, its source connected to the drain of input transistor, e.g., transistor MN 212 (and the source of transistor MN 216), and its drain connected to node X (i.e., gate of the output transistor MP 202), can be included to assist tying node X to $V_{INX}$ during the positive feedback loop action. The additional transistor is controlled by a clock signal which activates the positive feedback loop, e.g., CLK. Transistor MN 218 is on when CLK goes high at the startup to assist tying node X to $V_{INX}$, in an attempt to overcome the slow turn on of transistor MN 216. The jump start circuit 302 operates differently from the additional transistor MN 218, and the jump start circuit 302 can provide a greater amount of increase in speed of the bootstrapped switching circuit than the additional transistor MN 218 alone.

The timing of pulling down node X towards a low logic level and quickly letting go take into account or depend on factors such as the circuit design, the process in which the circuit is fabricated, and parasitics in the bootstrapped switching circuit. The timing can be determined from simulations or testing of the circuit. The timing can be variable or controllable. In some cases, the timing can depend on one or more voltage levels or signals in the bootstrapped switching circuit, which may indicate when the jump start circuit 302 should begin the pull down action and/or cease the pull down action.

If the transistor MP 202 is an NMOS transistor (in a complementary/equivalent implementation), the jump start circuit 302 can provide a momentary pull up function to quickly jump start the feedback loop.

Exemplary Implementations of the Jump Start Circuit

Figure 4A:
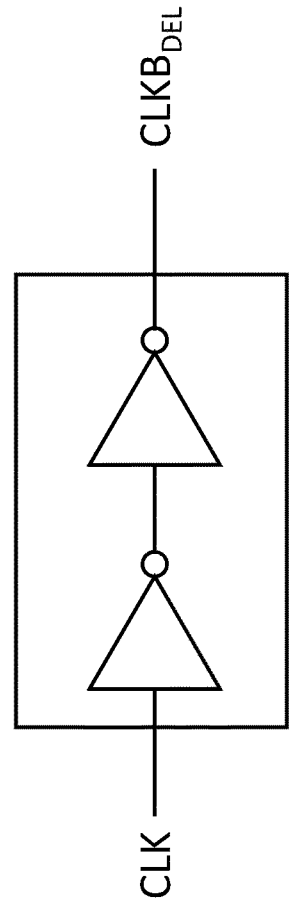
FIGS. 4A-B show an exemplary implementation for a jump start circuit, according to some embodiments of the disclosure.
Figure 4B:
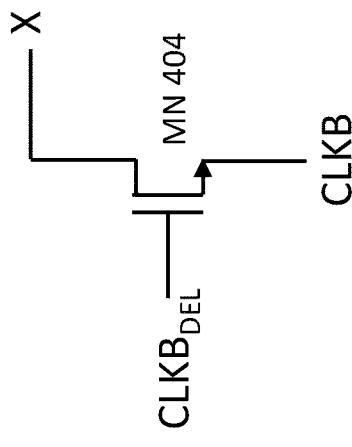

FIGS. 4A-B show an exemplary implementation for a jump start circuit, according to some embodiments of the disclosure. In this example shown in FIG. 4A, the jump start circuit includes a transistor MN 404 (e.g., NMOS transistor). Transistor MN 404 receives CLKB (used for activating the positive feedback loop, in the form of CLK and CLKB) at the source and $CLKB_{DEL}$ at the gate. CLKB goes low at the startup of the positive feedback loop. $CLKB_{DEL}$ is a delayed version of CLKB, and thus for a short period of time, $CLKB_{DEL}$ remains high when CLKB goes low. During this period of time, $CLKB_{DEL}$ being high when CLKB is low turns on transistor MN 404 and pulls node X towards CLKB's low logic level (e.g., ground). When the delay period is over, $CLKB_{DEL}$ goes low to turn transistor MN 404 off. This jump start circuit effectively pulls node X towards a low logic level and quickly lets go of node X to allow the positive feedback loop to continue its operation. In other words, the transistor is turned on by a delayed version of the clock signal to output the clock signal to turn on the output transistor for the limited period of time.

As illustrated by FIG. 4B, the jump start circuit can include two inverters for generating the delayed version of the clock signal $CLKB_{DEL}$ based on the clock signal CLKB. As a result, $CLKB_{DEL}$ can have the same polarity of CLKB but with two inverter delays. Other implementations for generating $CLKB_{DEL}$ with a desired amount of delay are envisioned by the disclosure, including using a pass gate, resistor-capacitor delay circuits, etc. The implementation shown in FIG. 4B is not meant to be limiting.

Figure 5C:
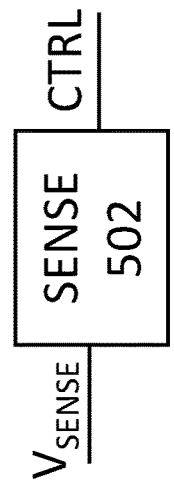
FIGS. 5A-C show another exemplary implementation for a jump start circuit, according to some embodiments of the disclosure.
Figure 5B:
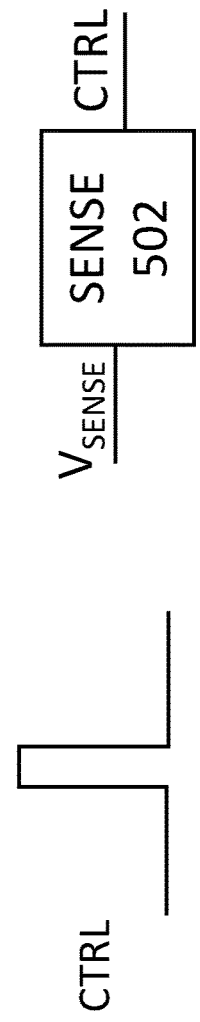
Figure 5A:
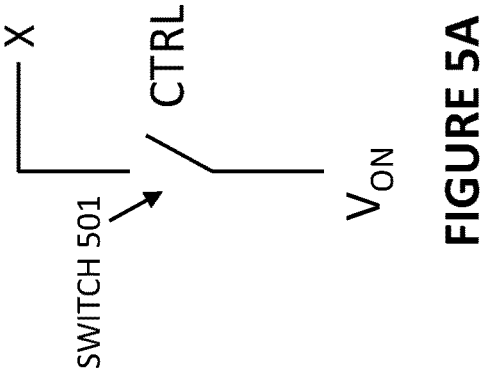

FIGS. 5A-C show another exemplary implementation for a jump start circuit, according to some embodiments of the disclosure. In this example shown in FIG. 5A, the jump start circuit includes a switch 501 controlled by control signal CTRL. The switch 501 connects a gate of the output transistor (e.g., transistor MP 202) to a bias voltage $V_{ON}$ for turning on the output transistor. The control signal can have a pulse to close the switch 501. The pulse can serve to jump start the output transistor for a limited period of time (pulling the gate to the bias voltage and letting go of the gate to allow the positive feedback loop to operate). FIG. 5B shows an exemplary waveform for the control signal CTRL, which has a short pulse used to close the switch and pull node X towards bias voltage $V_{ON}$ and quickly lets go of node X (opening the switch and disconnecting node X from $V_{ON}$) to allow the positive feedback loop to continue its operation. Voltage $V_{ON}$ can be a suitable bias voltage for turning transistor MP 202 on, e.g., ground, or some other suitable voltage level. Switch 501 can be implemented using transistor(s).

In some embodiments, the jump start circuit includes a sense circuit 502 (as shown in FIG. 5C) so that a closed loop delay can be implemented. The sense circuit activates the jump start circuit based on one or more conditions of the bootstrapped switching circuit indicating the startup of the positive feedback loop. A closed loop delay means that the control signal CTRL, or the timing of the jump start circuit for pulling node X to a low logic level and/or letting go of node X can be depend on one or more conditions of the bootstrapped switching circuit. Preferably, the one or more conditions indicate the startup of the positive feedback loop. The sense circuit 502 can sense a voltage $V_{SENSE}$ and generate the control signal CTRL accordingly. The voltage $V_{SENSE}$ can represent a voltage level at any suitable node in the bootstrapped switching circuit. The node can be a node in the positive feedback loop.

In one example, the sense circuit 502 includes a comparator coupled the source of the transistor MP 202 to compare the voltage at the source of the transistor MP 202 against a predetermined threshold, or another node in the positive feedback loop. The voltage passing across the predetermined threshold can indicate the startup of the positive feedback loop. If the voltage (e.g., the source of the transistor) rises above the predetermined threshold (indicating the positive feedback loop has begun its operation), the output of the comparator can trigger the control signal CTRL accordingly to shut off the jump start action.

A Method for Accelerated Turn on of a Sampling Switch

Figure 6:
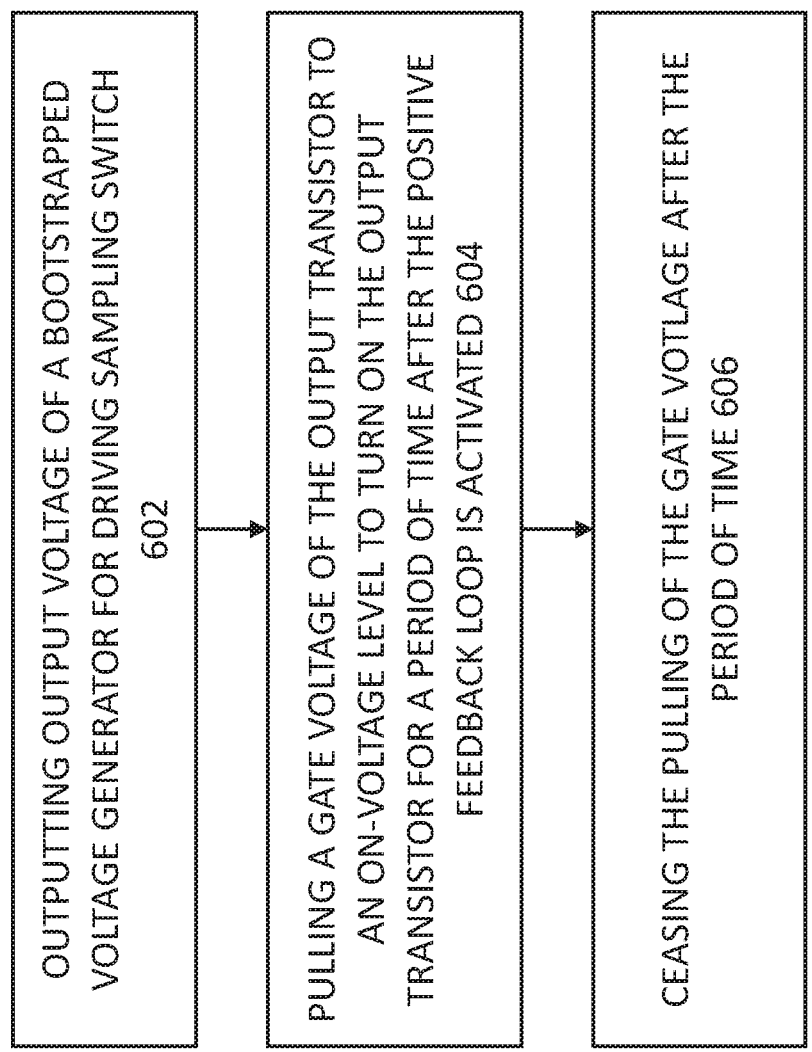
FIG. 6 is a flow diagram illustrating a method for accelerated turn on of a sampling switch.

FIG. 6 is a flow diagram illustrating a method for accelerated turn on of a sampling switch. In 602, an output transistor (e.g., transistor MP 202 of FIG. 3) of a positive feedback loop outputs an output voltage (e.g., $V_{BSTRP}$ of FIG. 3) of a bootstrapped voltage generator for driving the sampling switch (e.g., transistor MN 108 of FIG. 3). In some embodiments, the sampling switch receives a voltage input signal (e.g., $V_{INX}$ to be sampled). The positive feedback loop can receive the voltage input signal at an input transistor (e.g., transistor MN 212 of FIG. 3) driven by the output voltage (e.g., $V_{BSTRP}$ of FIG. 3) output by the output transistor. The positive feedback loop can generate a boosted voltage signal (e.g., bootstrapped voltage of $V_{INX}+V_{BOOT}$) based on the voltage input signal as the output voltage of the bootstrapped voltage generator to turn on the sampling switch when the positive feedback loop is engaged.

In 604, a jump start circuit can pull a gate voltage of the output transistor (e.g., node X of FIG. 3) to an on-voltage level to turn on the output transistor for a period of time after the positive feedback loop is activated. In some embodiments, pulling the gate voltage of the output transistor includes changing the gate voltage from an off-voltage level to an on-voltage level. Before the positive feedback action is engaged, the gate voltage can be at $V_{DD}$ as illustrated by FIGS. 2 and 3, which is considered an "off-voltage level" for transistor MP 202. The jump start circuit can momentarily pull the gate voltage to an "on-voltage level", such as a logical low voltage level to turn on the output transistor for a short period of time.

In 606, the jump start circuit can cease or stop the pulling of the gate voltage after the period of time. For instance, the jump start circuit can release the gate voltage of the output transistor back to a voltage being delivered by the positive feedback loop after the period of time. For instance, the jump start circuit can let the positive feedback loop operate and bring the gate voltage close to the input signal $V_{INX}$ to be sampled. In some embodiments, ceasing the pulling of the gate voltage after the period of time or releasing the gate voltage of the output transistor after the period of time includes allowing the positive feedback loop to bring the gate voltage to a voltage level of a voltage input signal (e.g., $V_{INX}$) provided to the bootstrapped voltage generator and the sampling switch.

In some embodiments, a sense circuit (e.g., sense circuit 502 of FIG. 5C) can sense one or more conditions indicating the positive feedback loop has been activated. The sense circuit can generate a control signal in response to sensing the one or more conditions. The control signal can trigger the pulling of the gate voltage of the output transistor.

An Apparatus for Accelerated Turn on of a Sampling Switch

For accelerated turn on of a sampling switch, an apparatus can include sampling means (e.g., transistor MN 108 of FIG. 3) receiving an input signal (e.g., $V_{INX}$ of FIG. 3) to be sampled and a control signal (e.g., $V_{BSTRP}$ of FIG. 3) which turns the sampling means on and off. The apparatus can further include means (e.g., transistor MN 210, $C_{BOOT}$, and transistor MN 224 of FIG. 3) for generating a boosted voltage signal based on the input signal (e.g., bootstrapped voltage of $V_{INX}+V_{BOOT}$). The apparatus can include output means for outputting the control signal (e.g., transistor MP 202 of FIG. 3). The apparatus can include means for bringing the control signal to the boosted voltage through positive feedback action of the control signal, as illustrated by FIGS. 2 and 3. The apparatus can include means (e.g., jump start circuit 302 of FIG. 3 and associated examples seen in FIGS. 4A-B and 5A-C) for turning on the output means for a limited period of time at a startup of the positive feedback action.

Input Buffer

CMOS input buffers (single ended) can include a stack of NMOS transistors and a current source. The voltage input to the input buffer can be directly connected to a gate of the NMOS transistor (whose source is connected to the current source), and the source of the NMOS transistor is the output. In this kind of input buffer, the output is shifted by one voltage across the gate and the source $V_{GS}$ downwards via the NMOS transistor buffering the voltage input from its gate to its source, i.e., the output. This voltage shift from the input to the output means that the output voltage range depend on the input voltage range. Phrased differently, there is an offset between the input voltage and the output voltage. If the input buffer is driving circuits that require a particular voltage range, this offset can be undesirable or cumbersome to address in the circuit design.

Figure 7:
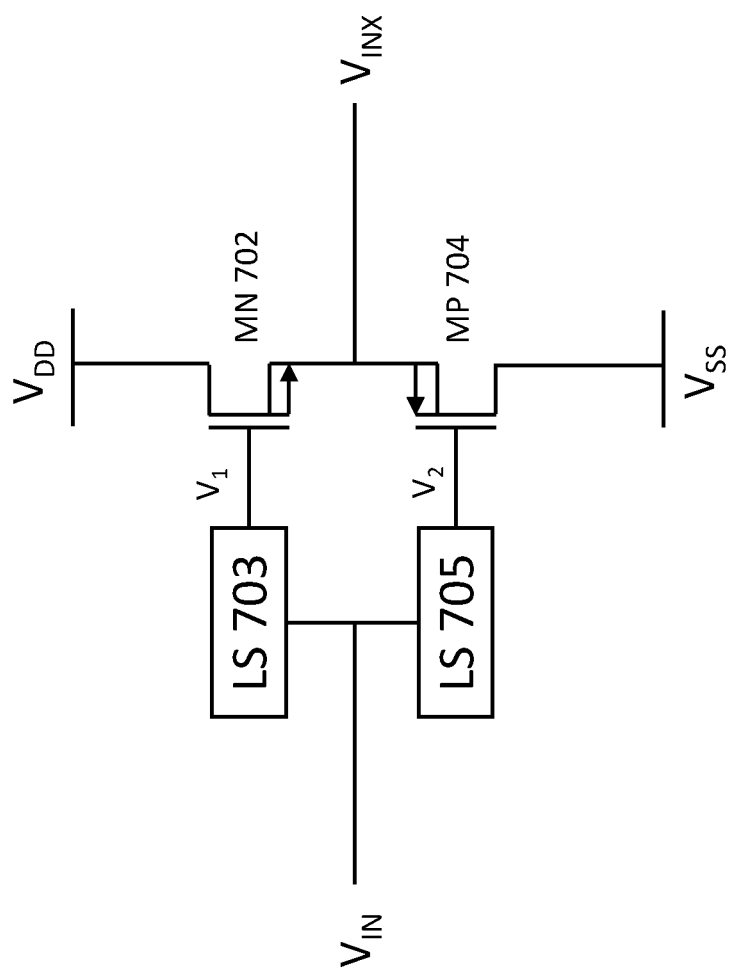
FIG. 7 shows an exemplary input buffer, according to some embodiments of the disclosure.

FIG. 7 shows an exemplary input buffer, according to some embodiments of the disclosure. The input buffer can be used in the manner illustrated by FIG. 1. The input buffer has an input $V_{IN}$ for receiving a voltage input signal. The voltage input signal can be a high frequency data signal to be converted by a data converter, such as a high speed ADC. The input buffer includes a push pull circuit outputting a voltage output signal at an output $V_{INX}$. The push pull circuit comprises a first transistor of a first type, and a second transistor of a second type complementary to the first type. For instance, the first transistor can be transistor MN 702 (e.g., NMOS transistor) and the second transistor can be transistor MP 704 (e.g., PMOS transistor). The sources of the two transistors are coupled to each other, and the sources also serves as the output $V_{INX}$ of the input buffer providing output signal $V_{INX}$.

For this input buffer, the transistors MN 702 and MP 704 are not directly connected to the input $V_{IN}$. Rather, the gate of transistor MN 702 is connected to the input $V_{IN}$ via level shifter 703, and the gate of transistor MP 704 is connected to the input $V_{IN}$ via level shifter 705. In some embodiments, the input buffer can include a first level shifter coupled to the input for shifting a voltage level of the voltage input signal by a first amount of voltage shift across the first level shifter and generating a first level shifted voltage signal to bias the first transistor. For example, level shifter 703 can shift $V_{IN}$ by a first amount of voltage shift (e.g., up by some amount of voltage) across the level shifter 703 and generate a first level shifted voltage $V_1$ to bias the first transistor, i.e., transistor MN 702. In some embodiments, the input buffer can include a second level shifter coupled to the input for shifting the voltage level of the voltage input signal by a second amount of voltage shift across the second level shifter and generating a second level shifted voltage signal to bias the second transistor. For example, level shifter 705 can shift $V_{IN}$ by a second amount of voltage shift (e.g., down by some amount of voltage) across the level shifter 705 and generate a second level shifted voltage $V_2$ to bias the second transistor, i.e., transistor MP 704.

In this input buffer seen in FIG. 7, the input buffer has a push pull architecture. The push pull architecture has at least an NMOS transistor MN 702 and PMOS transistor MP 704, whose source is connected to the source of a PMOS transistor MP 704. The sources are coupled together and form the output $V_{INX}$. For 28 nm CMOS process, PMOS and NMOS devices are complementary in behavior including bandwidth, capacitances, transconductance per unit current, etc. In some other processes, the PMOS transistors can have drastically different behavior than the NMOS transistors. This complementary push pull architecture using NMOS transistor(s) on one side and PMOS transistor(s) on the other side enables a complementary buffer to have the same behavior on the PMOS side and the NMOS side, in a process like the 28 nm CMOS process. The structure offers symmetric pull up and pull down characteristics, no matter which side is supplying a current to the output $V_{INX}$ to drive the load. The two sides are equal in strength, therefore achieving a symmetric pull up and pull down. From a distortion perspective, the complementary structure means that there can be less even order distortions (e.g., second order harmonics are reduced).

Besides the symmetric behavior, the input buffer is efficient because the NMOS transistor MN 702 and PMOS transistor MP 704, for a given amount of current going through the transistors, effectively double the transconductance of the input buffer. For the same amount of current, the NMOS transistor MN 702 and PMOS transistor MP 704 enable the input buffer to get two transconductances in parallel.

For this input buffer, it is not possible to tie the gates of NMOS transistor MN 702 and PMOS transistor MP 704 together, since shorting the gate of NMOS transistor MN 702 and PMOS transistor MP 704), neither transistor would turn on because there would not be any voltage across the gate and the source of either transistor (insufficient $V_{GS}$). Therefore, at least one of the two level shifters 703 and 705 is provided between the gates of NMOS transistor MN 702 and PMOS transistor MP 704. The level shifters pull the gates of the two transistors apart with sufficient difference in voltage across the gate and the source to keep the transistors on.

Level shifter 703 and level shifter 705 connected to $V_{IN}$ can be considered as (programmable) voltage shifts to bias the NMOS transistor MN 702 and PMOS transistor MP 704 at the gates of the respective transistors. In other words, the first amount of voltage shift can be programmable, and the second amount of voltage shift can be programmable. As used herein, a level shifter is a circuit which shifts a voltage level of an input to the level shifter by an amount to generate a level shifted voltage level at the output of the level shifter.

Biasing the NMOS transistor MN 702 and PMOS transistor MP 704, i.e., setting appropriate voltages $V_1$ and $V_2$, is not trivial. If the two gates are too far apart, too much current might flow through the two transistors. But if the two gates are not far enough apart (without enough $V_{GS}$ for both transistors, i.e., less than two $V_{GS}$'s) the transistors might not be turned on enough. Preferably, a desirable amount of current flows through the transistors. To ensure that the transistors have the desirable amount of current flowing through the transistors, a replica bias block can be used to set the voltages of level shifter 703 and level shifter 705 to ensure the NMOS transistor MN 702 and PMOS transistor MP 704 are running at the desired current.

Preferably, the difference in voltage between the gate of the NMOS transistor MN 702 and the gate of PMOS transistor MP 704 has to be at least two $V_{GS}$, e.g., threshold voltage $V_{GS}$ of the NMOS transistor MN 702 and threshold $V_{GS}$ of the PMOS transistor MP 704, and set to ensure a desired amount of current is running through the NMOS transistor MN 702 and PMOS transistor MP 704. In some embodiments, a sum of the first amount of voltage shift (e.g., of level shifter 703) and the second amount of voltage shift (e.g., of level shifter 705) is at least a sum of a first threshold voltage of the first transistor (e.g., transistor MN 702) and a second threshold voltage of the second transistor (e.g., transistor MP 704).

Input to Output Offset and Design Considerations for the Level Shifters

As a result of level shifter(s), the input $V_{IN}$ and the output $V_{INX}$ are independent, and the voltage range for the input and the voltage range for the output no longer have to depend on each other or have to be the same. Any offset between the input and the output can be selected by implementing appropriate level shifters (i.e., implementing level shifters 703 and 705 appropriately). By selecting the appropriate first amount of voltage shift and second amount of voltage shift, the voltage output signal at $V_{INX}$ can be offset or have an offset from the voltage input signal at $V_{IN}$. In one example, the voltage input signal can be centered at 0.5 volts, and the voltage input signal can be centered at 0.25 volts. The input buffer is more flexible.

In some cases, the input voltage at $V_{IN}$ and the output voltage at $V_{INX}$ can be roughly the same voltage. For instance, $V_{IN}$ goes up with level shifter 703, and down a gate to source voltage $V_{GS}$ of transistor MN 702 at the output $V_{INX}$. $V_{IN}$ goes down with level shifter 705, and up a gate to source voltage $V_{GS}$ of transistor MP 704 at the output $V_{INX}$. There is no input to output offset if appropriate level shifters are used. This feature is not available in other input buffers implementing a single source follower.

However, the input to output offset does not have to be zero either. Having the two level shifters means that the voltage range of the input $V_{IN}$ can be different from the voltage range of the output $V_{INX}$. With the two level shifters, as long as the difference in voltage between the gate of the NMOS transistor MN 702 and the gate PMOS transistor MP 704 is appropriate (i.e., biasing the transistors to have the desired current running through them), the input to output voltages can be adjusted to fit the application (e.g., if the offset is desirable).

The input to output offset can be variable. Used herein, variable means different over time, or different from one application to another application. The voltage shifts being provided by the level shifters can also be variable (and vice versa). A degree of freedom of the input buffer is that the level shifters 703 and 705 can be adjusted to have the particular output voltage range or voltage level.

In some embodiments, level shifters 703 and level shifters 705 (and other level shifters disclosed here) are variable or programmable. In some embodiments, one amount of voltage shift by a level shifter can differ from another amount of voltage shift by another level shifter in the input buffer. The amount of voltage shift can be user adjustable, and/or on-chip controllable. The amount of voltage shift can be optimized for other factors including distortions, electrostatic discharge (ESD), etc.

In some cases, one of level shifter 703 and level shifter 705 can be entirely omitted, where either the voltage at the gate of NMOS transistor MN 702 or the voltage at the gate of PMOS transistor MP 704 is level shifted to achieve the appropriate voltage difference between the gates of the two transistors.

Implementing a Level Shifter

One aspect of the level shifter is its ability to provide an amount of voltage shift, from the input to the gate of the transistors, independent of input frequency, or all the way to DC (i.e., zero frequency or constant input $V_{IN}$). In other words, the level shifted signal would follow the input $V_{IN}$ across all frequencies of the input. Some other level shifters would not have such a frequency response.

The level shifter can be implemented in different ways. For instance, a level shifter can include one or more of the following: one or more current sources, one or more resistors, one or more transistors, one or more diodes, one or more diode-connected transistors, one or more capacitors, one or more batteries, and one or more non-linear resistors. In some embodiments, the level shifter includes means for providing a voltage shift which is controlled by an amount of current flowing through the level shifter, and can be independent of the input frequency. For instance, a diode-connected transistor can provide a voltage level shift which depends on a current flowing through the diode-connected transistor (the current can be provided by one or more current sources). In some embodiments, the level shifter can include switched capacitor circuits. Preferably, a level shifter is implemented using passive circuit elements (as opposed to active elements involving complementary transistors as followers that shift up or down from the input). Passive circuit elements use less current and can be less noisy and more linear than active circuit elements. Passive circuit elements can include diode connected transistor(s), resistor(s), capacitor(s) circuits, and suitable combination thereof.

Figure 8:
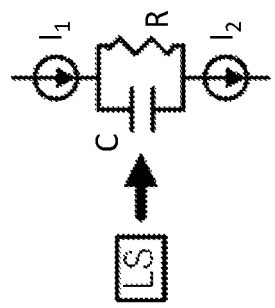
FIG. 8 shows an exemplary level shifter, according to some embodiments of the disclosure.

FIG. 8 shows an exemplary level shifter, according to some embodiments of the disclosure. The exemplary level shifter includes current sources, with a resistor and a capacitor in parallel between the current sources. For instance, a level shifter mentioned herein can include one or more current sources (e.g., $I_1$ and $I_2$), and a resistor (or resistive element, e.g., R) and a capacitor (or a capacitive element, e.g., C) in parallel with the resistor. The resistor and the capacitor in parallel with the resistor are between current sources $I_1$ and $I_2$. Other configurations of these circuit elements are envisioned by the disclosure. Any current provided by the current sources would flow through the resistor and capacitor in parallel. The resistor and the amount of current flowing through the resistor sets the voltage shift across the level shifter (voltage shift can equal to the amount of current multiplied by the resistance). In other words, an amount of current, flowing through the resistor and provided by the current sources, sets an amount of voltage shift across the level shifter. For a programmable level shifter, the amount of current can be programmable, or the amount of resistance of the resistor can be programmable. Any one of the level shifters can be implemented in the manner described and illustrated herein. Depending on the particular application or the level shifter, the values of the different components within the level shifters may vary.

Bootstrapping Back Gates of the Main Transistors

Achieving high performance for an input buffer, such as good linearity, is not trivial. In some embodiments, a first back gate of the first transistor (e.g., transistor MN 702) and a second back gate of the second transistor are coupled to the output $V_{INX}$ or follows the voltage output signal $V_{INX}$. For instance, back gates (body) of the NMOS transistor MN 702 and PMOS transistor MP 704 are tied directly to the output $V_{INX}$, i.e., the back gates are bootstrapped to the output node $V_{INX}$. If the back gates of NMOS transistor MN 702 and PMOS transistor MP 704 are tied to some fixed voltage, e.g., ground and $V_{DD}$, as the input $V_{IN}$ vary, the $V_{GS}$ of the two transistor would also vary. The change in voltage between the source and the back gate would change the $V_{GS}$ of the transistors. The variation could also modulate the threshold voltage $V_{GS}$ and the capacitance of the transistor. The variation(s) can cause distortions. To avoid this issue, the back gate NMOS transistor MN 702 and PMOS transistor MP 604 are tied or bootstrapped to the output $V_{INX}$. For all values of the input signal $V_{IN}$ (and $V_{INX}$ following $V_{IN}$), the voltage between the back gate and the source of the transistors is zero. $V_{GS}$ no longer varies as the input signal $V_{IN}$ varies. Capacitance in the transistor can be shorted. Performance is improved. The input buffer seen in FIG. 7 along with at least some of the features described so far can reduce of some of the non-linearities or variations (first order).

Minimizing Capacitances to Improve Performance

When the input buffer is driving a high frequency input signal $V_{IN}$, it is preferable to minimize all the capacitances that matter, or at least make the capacitance constant. Or, if the capacitances are going vary, it is preferable to reverse bias the junction causing the capacitance as much as possible so that the variation in the capacitance is small, or at least make the voltage across the capacitor constant to reduce the variation. Reverse biasing the junction, i.e., the voltage dependent junction capacitor, as much as possible can make the capacitance smaller and less non-linear.

Tying the back gate to the source (and output $V_{INX}$) of transistor MN 702 creates a capacitance between the back gate and the deep N-well. The N-well is at a fixed potential, and the back gate is moving around with the signal. NMOS transistor MN 702 can be in its own isolated P-Well (back gate), which can be inside a deep N-well isolation region. A capacitance between a back gate and a deep N-well of a first transistor (e.g., transistor MN 702) can be reversed biased. For instance, the deep N-well can be tied to a high potential, so that the capacitance between the back gate (P) and the deep N-well (N) is as strongly reversed biased as possible (for reasons mentioned above). As a result, the undesirable effect of the capacitance can be reduced (e.g., making it more linear). The input buffer seen in FIG. 7 along with at least some of the features described so far can reduce of some of the non-linearities or variations (first order).

Bootstrapped Cascodes to Improve Performance

If the input buffer is made using 28 nm CMOS process technology, the output conductance, or the ratio of the conductance $G_{DS}$ to the transconductance $G_M$ is small and highly non-linear. This can make it undesirable to tie the drain of NMOS transistor MN 702 and the drain of PMOS transistor MP 704 to a fixed supply, because as the signal $V_{IN}$ or $V_{INX}$ moves up and down, that varies the voltage across the transistor, i.e., $V_{DS}$ (drain to source voltage), is moving up and down. This can cause, e.g., 25-40 dBs of distortion. One way to fix this distortion is to bootstrap the drain of NMOS transistor MN 702 and the drain of PMOS transistor MP 704 (e.g., the input $V_{IN}$ or the output $V_{INX}$), so that it is no longer fixed to some supply voltage.

Figure 9:
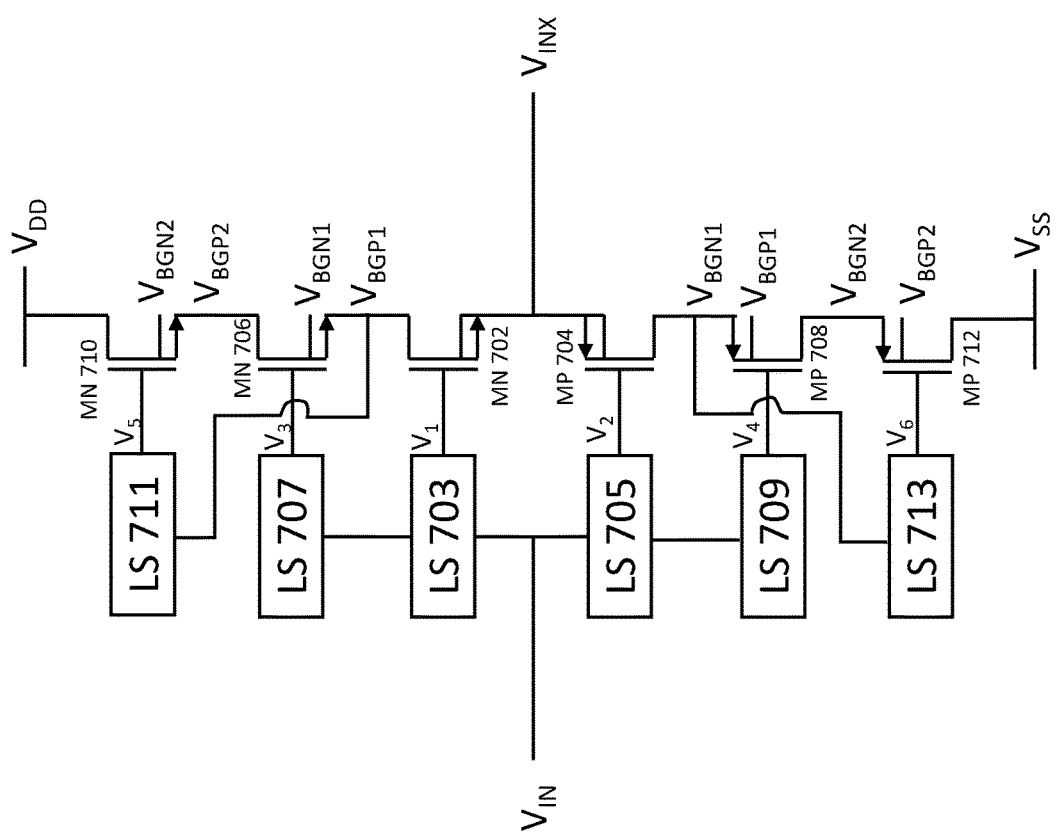
FIG. 9 shows another exemplary input buffer, according to some embodiments of the disclosure.

FIG. 9 shows another exemplary input buffer, according to some embodiments of the disclosure. The push pull circuit of the input buffer further includes a third transistor of the first type (e.g., transistor MN 706) in cascode configuration with the first transistor (e.g., transistor MN 702), and a fourth transistor of the second type (e.g., transistor MP 708) in cascode configuration with the second transistor (e.g., transistor MP 704). One or more bootstrapped cascodes, e.g., transistors in cascode configuration with the first/second transistor can be provided to boost the effective output impedance and therefore SFDR. The cascodes can require the use of higher supply voltages to improve the performance of the input buffer. Additional cascodes further improves performance.

The first cascode is transistor MN 706 (e.g., NMOS transistor), which is another follower tied to the input $V_{IN}$. The gate of transistor MN 706 can be tied to the input $V_{IN}$ via level shifter 707 and level shifter 703 in series (as shown). In some embodiments, level shifter 707 can be directly coupled to the input $V_{IN}$. The level shifter 707 or the level shifters 707 and 703 in series can serve as a third level shifter coupled to the input $V_{IN}$ for shifting the voltage level of the voltage input signal by a third amount of voltage shift across the third level shifter and generating a third level shifted voltage signal $V_3$ to bias the third transistor, e.g., transistor MN 706. The first cascode MN 706, its gate is being driven by the input $V_{IN}$ (going up and down), has a specific level shifter 707 such that the output voltage (MN 706's source), provides enough $V_{DS}$ for transistor MN 702 to operate in saturation under all conditions. Transistor MN 706 is bootstrapped to the input $V_{IN}$ to isolate the transistor MN 702 from variation in $V_{DS}$. If the drain of transistor MN 706 (exactly) follows the input or the output, then $V_{DS}$ would be substantially constant (no variation).

Depending on the level of distortion tolerated, more cascode(s) can be added to serve this function, such as transistor MN 710 (e.g., NMOS transistor). Each cascode can provide an additional 20 dB in performance. Since the input buffer has a complementary design, cascode(s) being added to the NMOS side is also added to the PMOS side. Accordingly, transistor MP 708 (e.g., PMOS transistor) can be added to bootstrap and fix $V_{DS}$ of transistor MP 704. The gate of transistor MP 708 can be tied to the input $V_{IN}$ via level shifter 709 and level shifter 705 in series. In some embodiments, level shifter 709 can be directly coupled to the input $V_{IN}$. The level shifter 709 or the level shifters 709 and 705 in series can serve as a fourth level shifter coupled to the input $V_{IN}$ for shifting the voltage level of the voltage input signal by a fourth amount of voltage shift across the fourth level shifter and generating a fourth level shifted voltage signal $V_4$ to bias the fourth transistor, e.g., transistor MP 708.

In the example shown, the push pull circuit of the input buffer further includes a fifth transistor of the first type (e.g., transistor MN 710) in cascode configuration with the third transistor (e.g., transistor MN 706), and a sixth transistor of the second type (e.g., transistor MP 712) in cascode configuration with the fourth transistor (e.g., transistor MP 708). In other words, the second cascode on the NMOS side, i.e., transistor MN 710, finally connects to supply. Also, a second cascode on the PMOS side, i.e., transistor MP 712 (e.g., PMOS transistor), finally connects to supply.

The gate of upper most cascode MN 710 is driven from the source of the first cascode on the NMOS side, e.g., via level shifter 711. Level shifter 711 can be a fifth level shifter coupled to a source of the third transistor (e.g., transistor MN 706) for shifting a voltage at the source of the third transistor by a fifth amount of voltage shift across the fifth level shifter and generating a fifth level shifted voltage signal $V_5$ to bias the fifth transistor (e.g., transistor MN 710). The gate of lower most cascode MP 712 is driven from the source of the first cascode on the PMOS side, e.g., via level shifter 713. Level shifter 716 can be a sixth level shifter coupled to a source of the fourth transistor (e.g., transistor MP 708) for shifting a voltage at the source of the fourth transistor by a sixth amount of voltage shift across the sixth level shifter and generating a sixth level shifted voltage signal $V_6$ to bias the sixth transistor (e.g., transistor MN 710). This bootstrapping scheme (e.g., bootstrapping to the sources of the third/fourth transistor and drains of the first/second transistor) unloads the buffer input and output (both of which are candidates to bootstrap from) from the non-bootstrapped gate-drain capacitance of the upper cascode connected to the supply, which could be a significant source of distortion.

In the examples shown in FIGS. 7 and 9, the bootstrapping is done primarily by tying the gates of the transistors the input (or some other node which follows the input). This feature was selected to reduce possible ringing, which can be caused by bootstrapping the gates to the output. While the bootstrapping to the input can load the input and adds extra parasitics, high speed applications may prefer an input buffer that suffers from less ringing. While there could potentially be some ringing from the upper cascode since it is bootstrapped to the source of the first cascode, the ringing may be tolerated over an alternative solution where the distortions at the source of the upper cascode could distort the input $V_{IN}$ and output $V_{INX}$ if it was bootstrapped to the input or the output.

Further, the back gate of the various cascode transistors in the input buffer are bootstrapped as shown in FIG. 9 to improve SFDR. Similar to the description of the back gates of transistors MN 702 and MP 704, the back gates of the cascodes preferably being bootstrapped as well (i.e., it is undesirable to have voltage across the back gate and the source to vary). Unfortunately, in some implementations, $V_{SS}$ is negative, which means that the drain of the transistor MP 708 swings negative. In 28 nm CMOS process technology, the N-well of the PMOS transistors sit in the substrate, and substrate is at 0 volts. If N-well goes negative, it forward biases the diode between the P substrate (at 0 volts) and all the N wells (cathode end of the diode). If the N terminal goes below ground, it forward biases the diode and causes distortions. Tying the back gates of the cascodes on the PMOS side to the sources of the respective cascodes (same cascode) means it can cause distortions. The solution is to tie the back gates of the cascodes to each other, i.e., the back gate of an NMOS cascode is connected to a source of corresponding/complementary PMOS cascode, and vice versa. The sources are following the input and thus tying them to each other helps to bootstrap the back gates of the cascodes (to the input). Denoted by $V_{BGN1}$, a back gate of the third transistor (e.g., transistor MN 706) is coupled to a source of the fourth transistor (e.g., transistor MP 708). Denoted by $V_{BGP1}$, a back gate of the fourth transistor (e.g., transistor MP 708) is coupled to a source of the third transistor (e.g., transistor MN 706). Denoted by $V_{BGN2}$, a back gate of the fifth transistor (e.g., transistor MN 710) is coupled to a source of the sixth transistor (e.g., transistor MP 712). Denoted by $V_{BGP2}$, a back gate of the sixth transistor (e.g., transistor MP 712) is coupled to a source of the fifth transistor (e.g., transistor MN 710).

Tying the back gate to the output is less desirable because it would load it with a non-linear capacitance. Linearity is improved since there is now a large voltage across the junction. While the cascodes on the NMOS side can tie the back gates to their respective sources, the complementary design of tying the back gates to the sources of the complementary cascode is preferable to achieve a complementary design and equalize loading for symmetric pull up and pull down behavior.

Method for Buffering a Voltage Input Signal

FIG. 10 is a flow diagram for buffering an input signal, according to some embodiments of the disclosure. In 1002, a first voltage shift set by (one or more current sources of) a first level shifter shifts the voltage input signal to generate a first signal. In 1002, a second voltage shift set by (one or more current sources of) a second level shifter shifts the voltage input signal to generate a second signal. The first voltage shift and second voltage shift can represent the level shifters 703 and 705 of FIGS. 7 and 9. The first signal and the second signal can represent $V_1$ and $V_2$ of FIGS. 7 and 9. In 1004, the first signal biases a first transistor of a first type. In 1004, the second signal biases a second transistor of a second type complementary to the first type. The first transistor and the second transistor are coupled in a push pull architecture, as illustrated by transistor MN 702 and transistor MP 704 of FIGS. 7 and 9. In 1006, the first transistor and the second transistor output a voltage output signal, e.g., $V_{INX}$ of FIGS. 7 and 9.

In some embodiments, a third signal biases a first cascode transistor coupled to the first transistor. The third signal can follow the voltage input signal. In some embodiments, a fourth signal biases a second cascode transistor coupled to the second transistor. The fourth signal can follow the voltage input signal. For instance, the third/fourth signal can be the signal $V_3$ or $V_4$ of FIG. 9.

In some embodiments, a fifth signal biases a third cascode transistor coupled to the first cascode transistor. The fifth signal can also follow the voltage input signal. In some embodiments, a sixth signal biases a fourth cascode transistor coupled to the first cascode transistor. The fifth signal can also follow the voltage input signal. For instance, the fifth/sixth signal can be the signal $V_5$ or $V_6$ of FIG. 9.

Apparatus for Buffering an Input Signal

An apparatus for buffering an input signal can include means for implementing the methods described herein. In some embodiments, the apparatus includes means for receiving an input signal. For instance, an input node can be provided to receive an input signal (e.g., $V_{IN}$ of FIGS. 1, 7, and 9), such as a high frequency signal to be converted by a data converter. The apparatus can further include push pull means for generating an output signal. Push pull means can include the push pull circuit and push pull architecture described herein (e.g., transistors seen in FIGS. 7 and 9). The apparatus can further include means for generating a first signal for biasing a first transistor of the push pull means. The first signal follows the input signal across all frequencies of the input signal. Further means can be included for generating other signals for biasing other transistors of the push pull means. The means for generating signals for biasing transistors can include level shifters described in relation to FIGS. 7-9.

The means for generating signals for biasing transistors (bootstrapping the transistors to the input) are distinguishable from other circuits which generate a biasing signal based on fixed/predetermined bias voltages. The means for generating the signals for biasing transistors follows the input signal or is bootstrapped to the input signal across all frequencies of the input signal, i.e., all the way to DC. In contrast, the other circuits which generate a biasing signal based on fixed/predetermined bias voltages do not follow the input signal across all frequencies of the input signal.

For those other circuits, signals for biasing transistors can be generated using a fixed biasing voltage and a resistor, and a capacitor in series with the input. Such signals for biasing transistors does not buffer or follow the input signal at low frequencies because the capacitor has a high impedance at low frequencies and the resistor dominates. Therefore, the non-bootstrapped biasing signal would be set by the fixed biasing voltage and the resistor at low frequencies (and does not respond to the input signal). In contrast, the level shifters described herein as means for generating the (bootstrapped) signals for biasing transistors can respond to the input signal across all frequencies (at low and high frequencies), since the level shifters described herein have a different frequency response.

EXAMPLES

Example 1 is an input buffer comprising: a input receiving a voltage input signal; a push pull circuit outputting a voltage output signal at an output, wherein the push pull circuit comprises a first transistor of a first type, a second transistor of a second type complementary to the first type; and a first level shifter coupled to the input for shifting a voltage level of the voltage input signal by a first amount of voltage shift across the first level shifter and generating a first level shifted voltage signal to bias the first transistor, wherein the first amount of voltage shift provided by the first level shifter is independent of a frequency of the voltage input signal.

In Example 2, Example 1 can further include a second level shifter coupled to the input for shifting the voltage level of the voltage input signal by a second amount of voltage shift across the second level shifter and generating a second level shifted voltage signal to bias the second transistor.

In Example 3, Example 1 or 2 can further include the first amount of voltage shift being programmable.

In Example 4, any one of Examples 1-3 can further include an amount of current, flowing through a resistive element and provided by one or more current sources, setting the first amount of voltage shift across the first level shifter.

In Example 5, any one of Examples 1-4 can further include a sum of the first amount of voltage shift and the second amount of voltage shift being at least a sum of a first threshold voltage of the first transistor and a second threshold voltage of the second transistor.

In Example 6, any one of Examples 1-5 can further include the first amount of voltage shift being different from the second amount of voltage shift.

In Example 7, any one of Examples 1-6 can further include the voltage output signal being offset from the voltage input signal.

In Example 8, any one of Examples 1-7 can further include a first back gate of the first transistor and a second back gate of the second transistor being coupled to the output or follows the voltage output signal.

In Example 9, any one of Examples 1-8 can further include a capacitance between a back gate and a deep N-well of a first transistor being reversed biased.

In Example 10, any one of Examples 1-9 can further include the push pull circuit further comprising: a third transistor of the first type in cascode configuration with the first transistor; and a fourth transistor of the second type in cascode configuration with the second transistor.

In Example 11, any one of Examples 1-10 can further include a third level shifter coupled to the input for shifting the voltage level of the voltage input signal by a third amount of voltage shift across the third level shifter and generating a third level shifted voltage signal to bias the third transistor.

In Example 12, any one of Examples 1-11 can further include the push pull circuit further comprising: a fifth transistor of the first type in cascode configuration with the third transistor; and a sixth transistor of the second type in cascode configuration with the fourth transistor.

In Example 13, any one of Examples 1-12 can further include a fourth level shifter coupled to a source of the third transistor for shifting a voltage at the source of the third transistor by a fourth amount of voltage shift across the fourth level shifter and generating a fourth level shifted voltage signal to bias the fifth transistor.

In Example 14, any one of Examples 1-12 can further include: a back gate of the third transistor being coupled to a source of the fourth transistor; and a back gate of the fourth transistor being coupled to a source of the third transistor.

In Example 15, any one of Examples 1-14 can further include: a back gate of the fifth transistor being coupled to a source of the sixth transistor; and a back gate of the sixth transistor being coupled to a source of the fifth transistor.

Example 16 is a method for buffering a voltage input signal, the method comprising: level shifting the voltage input signal by a first voltage shift of a first level shifter to generate a first signal, wherein the first voltage shift is independent of a frequency of the voltage input signal; biasing, by the first signal, a first transistor of a first type; biasing, by a second signal, a second transistor of a second type complementary to the first type, wherein the first transistor and the second transistor are coupled in a push pull architecture; and outputting, by the first transistor and the second transistor, a voltage output signal.

In Example 17, Example 16 can further include level shifting the voltage input signal by a second voltage shift set by a second level shifter to generate the second signal.

In Example 18, Example 16 or 17 can further include biasing, by a third signal, a first cascode transistor coupled to the first transistor, wherein the third signal follows the voltage input signal.

In Example 19, any one of Examples 16-18 can further include biasing, by a fourth signal, a second cascode transistor coupled to the first cascode transistor, wherein the fourth signal follows the voltage input signal.

Example 20 is an apparatus comprising: means for receiving an input signal; push pull means for generating an output signal; and (passive) means for generating a first signal for biasing a first transistor of the push pull means, wherein the first signal follows the input signal across all frequencies of the input signal.

Example 21 is an apparatus comprising means for implementing/carrying out any one of the methods in Examples 16-19.

Example 101 is a bootstrapped switching circuit with accelerated turn on, comprising: a sampling switch receiving a voltage input signal and a gate voltage; a bootstrapped voltage generator comprising a positive feedback loop to generate the gate voltage for turning on the sampling switch, said positive feedback loop comprising an input transistor receiving the voltage input signal and an output transistor outputting the gate voltage of the sampling switch; and a jump start circuit to turn on the output transistor for a limited period of time during which the input transistor is turning on at a startup of the positive feedback loop.

In Example 102, Example 101 can further include the jump start circuit being coupled to a gate of the output transistor.

In Example 103, Example 101-102 can further include the jump start circuit ceasing to turn on the output transistor after the limited period of time and allows the positive feedback loop to operate.

In Example 104, any one of Examples 101-103 can further include: the jump start circuit comprising a transistor receiving a clock signal used for activating the positive feedback loop; and the transistor being turned on by a delayed version of the clock signal to output the clock signal to turn on the output transistor for the limited period of time.

In Example 105, any one of Examples 101-104 can further include the jump start circuit further comprising two inverters for generating the delayed version of the clock signal based on the clock signal.

In Example 106, any one of Examples 101-105 can further include: the jump start circuit comprising a switch for connecting a gate of the output transistor to a bias voltage for turning on the output transistor; and the switch is controlled by a control signal having a pulse to close the switch.

In Example 107, any one of Examples 101-106 can further include the jump start circuit comprising a sense circuit for activating the jump start circuit based on one or more conditions of the bootstrapped switching circuit indicating the startup of the positive feedback loop.

In Example 108, any one of Examples 101-107 can further include the sense circuit sensing a voltage representing a voltage level at a node in the bootstrapped switching circuit.

In Example 109, any one of Examples 101-108 can further include the node is at a node in the positive feedback loop.

In Example 110, any one of Examples 101-109 can further include the sense circuit comprising a comparator comparing the voltage against a predetermined threshold indicating the startup of the positive feedback loop.

In Example 111, any one of Examples 101-110 can further include: the positive feedback loop comprising a boot capacitor; and the positive feedback loop turning on the sampling switch by bringing the gate voltage to a boosted voltage generated based on the voltage input signal and a voltage across the boot capacitor.

In Example 112, any one of Examples 101-111 can further include: the input transistor being coupled to a first plate of the boot capacitor; and the output transistor being coupled to a second plate of the boot capacitor.

In Example 113, any one of Examples 101-112 can further include: the input transistor being driven by the gate voltage of the sampling switch; and the positive feedback loop further comprising a first transistor coupled to a gate of the output transistor and a drain of the input transistor, wherein the first transistor is driven by the gate voltage of the sampling switch.

In Example 114, any one of Examples 101-113 can further include: the positive feedback loop further comprising: an additional transistor coupled to a gate of the output transistor and a drain of the input transistor, wherein the additional transistor is controlled by a clock signal which activates the positive feedback loop.

Example 115 is a method for accelerated turn on of a sampling switch, comprising: outputting, by an output transistor of a positive feedback loop, an output voltage of a bootstrapped voltage generator for driving the sampling switch; pulling a gate voltage of the output transistor to an on-voltage level to turn on the output transistor for a period of time after the positive feedback loop is activated; and ceasing the pulling of the gate voltage after the period of time.

In Example 116, Example 115 can further include: the sampling switch receiving a voltage input signal; and the positive feedback loop receiving the voltage input signal at an input transistor driven by the output voltage output by the output transistor, and generates a boosted voltage signal based on the voltage input signal as the output voltage of the bootstrapped voltage generator to turn on the sampling switch when the positive feedback loop is engaged.

In Example 117, Example 115 or 116 can further include pulling the gate voltage of the output transistor comprising changing the gate voltage from an off-voltage level to an on-voltage level.

In Example 118, any one of Examples 115-117 can further include: allowing the positive feedback loop to bring the gate voltage to a voltage level of a voltage input signal provided to the bootstrapped voltage generator and the sampling switch after the period of time.

In Example 119, any one of Examples 115-118 can further include: sensing one or more conditions indicating the positive feedback loop has been activated; and generating a control signal in response to sensing the one or more conditions, wherein the control signal triggers the pulling of the gate voltage of the output transistor.

Example 120 is an apparatus comprising: sampling means receiving an input signal to be sampled and a control signal which turns the sampling means on and off; means for generating a boosted voltage based on the input signal; output means for outputting the control signal; means for bringing the control signal to the boosted voltage through positive feedback action of the control signal; and means for turning on the output means for a limited period of time at a startup of the positive feedback action.

Example 121 is an apparatus comprising means for implementing/carrying out any one of the methods in Examples 115-119.

Variations and Implementations

A source of a transistor, e.g., metal-oxide-semiconductor field-effect transistor (MOSFET), is where charge carriers enter a channel of a transistor. A drain of the transistor is where the charge carriers leave the channel. In some cases, the source and the drain can be considered as two terminals of the transistor. A gate of a transistor can be considered a control terminal of the transistor, because the gate can control the conductivity of the channel (e.g., an amount of current through a transistor). A back gate (body) of a transistor can also be considered as a control terminal of the transistor. Gates and back gates can be used as terminals for biasing a transistor.

Note that the activities discussed above with reference to the FIGURES are applicable to any integrated circuits that involve processing analog signals and converting the analog signals into digital data using one or more ADCs. In certain contexts, the features discussed herein related to ADCs in general, including, e.g., ADCs of various flavors including pipeline ADCs, delta sigma ADCs, successive approximation register ADCs, multi-stage ADCs, time-interleaved ADCs, randomized time-interleaved ADCs, etc. The features can be particularly beneficial to high speed ADCs, where input frequencies are relatively high in the gigahertz range. The ADC can be applicable to medical systems, scientific instrumentation, wireless and wired communications systems (especially systems requiring a high sampling rate), radar, industrial process control, audio and video equipment, instrumentation, and other systems which uses ADCs. The level of performance offered by high speed ADCs can be particularly beneficial to products and systems in demanding markets such as high speed communications, medical imaging, synthetic aperture radar, digital beam-forming communication systems, broadband communication systems, high performance imaging, and advanced test/measurement systems (oscilloscopes).

The present disclosure encompasses apparatuses which can perform the various methods described herein. Such apparatuses can include circuitry illustrated by the FIGURES and described herein. Parts of various apparatuses can include electronic circuitry to perform the functions described herein. The circuitry can operate in analog domain, digital domain, or in a mixed-signal domain. In some cases, one or more parts of the apparatus can be provided by a processor specially configured for carrying out the functions described herein (e.g., control-related functions, timing-related functions). In some cases that processor can be an on-chip processor with the ADC. The processor may include one or more application specific components, or may include programmable logic gates which are configured to carry out the functions describe herein. In some instances, the processor may be configured to carrying out the functions described herein by executing one or more instructions stored on a non-transitory computer medium.

In the discussions of the embodiments herein, the parts and components can readily be replaced, substituted, or otherwise modified in order to accommodate particular circuitry needs. Moreover, it should be noted that the use of complementary electronic devices, hardware, etc. offer an equally viable option for implementing the teachings of the present disclosure. For instance, complementary configurations using PMOS transistor(s) (p-type metal-oxide semi-conductor transistor(s)) to replace NMOS transistor(s) (p-type metal-oxide semiconductor transistor(s)) or vice versa, are envisioned by the disclosure. For instance, the present disclosure/claims encompasses implementations where all NMOS devices are replaced by PMOS devices, or vice versa. Connections and the circuit can be reconfigured to achieve the same function. These implementations are equivalent to the disclosed implementations using complementary transistors devices because the implementations would perform substantially the same function in substantially the same way to yield substantially the same result. It is understood by one skilled in the art that a transistor device can be generalized as a device having three (main) terminals. Furthermore, it is understood by one skilled in the art that a switch, a transistor, or transistor device, during operation, can have a characteristic behavior of transistors corresponding to devices such as NMOS, PMOS devices (and any other equivalent transistor devices).

In one example embodiment, any number of components of the FIGURES may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In another example embodiment, the components of the FIGURES may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on-chip (SOC) package, either in part, or in whole. An SOC represents an IC that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the error calibration functionalities may be implemented in one or more silicon cores in Application Specific Integrated Circuits (ASICs), Field Programmable Gate Arrays (FPGAs), and other semiconductor chips.

It is also imperative to note that all of the specifications, dimensions, and relationships outlined herein (e.g., the number of processors, logic operations, etc.) have only been offered for purposes of example and teaching only. Such information may be varied considerably without departing from the spirit of the present disclosure, or the scope of the appended claims (if any) or examples described herein. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the appended claims (if any) or examples described herein. The description and drawings are, accordingly, to be regarded in an illustrative rather than in a restrictive sense.

Note that with the numerous examples provided herein, interaction may be described in terms of two, three, four, or more electrical components or parts. However, this has been done for purposes of clarity and example only. It should be appreciated that the system can be consolidated in any suitable manner. Along similar design alternatives, any of the illustrated components, modules, blocks, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments. It is also important to note that the functions described herein illustrate only some of the possible functions that may be executed by, or within, systems/circuits illustrated in the FIGURES. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure. Numerous other changes, substitutions, variations, alterations, and modifications may be ascertained to one skilled in the art and it is intended that the present disclosure encompass all such changes, substitutions, variations, alterations, and modifications as falling within the scope of the appended claims (if any) or examples described herein. Note that all optional features of the apparatus described above may also be implemented with respect to the method or process described herein and specifics in the examples may be used anywhere in one or more embodiments.

What is claimed is:

1. A bootstrapped switching circuit with accelerated turn on, comprising:
   a sampling switch to receive a voltage input signal and a gate voltage;
   a bootstrapped voltage generator comprising a positive feedback loop, wherein the positive feedback loop is activated by a clock signal to generate the gate voltage for turning on the sampling switch, and the positive feedback loop comprises: an output transistor to output the gate voltage of the sampling switch, and an input transistor to receive the voltage input signal and to be driven by the gate voltage as positive feedback; and
   a jump start circuit to turn on the output transistor, and to cease turning on the output transistor after a limited period of time during a startup of the positive feedback loop to allow the positive feedback loop to continue assisting the output transistor in generating the gate voltage for turning on the sampling switch.

2. The bootstrapped switching circuit of claim 1, wherein the jump start circuit is coupled to a gate of the output transistor.

3. The bootstrapped switching circuit of claim 1, wherein the jump start circuit disengages from the output transistor after the limited period of time to allow the positive feedback loop to bring a gate voltage of the output transistor to a voltage level of the voltage input signal.

4. The bootstrapped switching circuit of claim 1, wherein:
   the jump start circuit comprises a transistor receiving the clock signal used for activating the positive feedback loop; and
   the transistor is turned on by a delayed version of the clock signal to output the clock signal to turn on the output transistor for the limited period of time.

5. The bootstrapped switching circuit of claim 4, wherein the jump start circuit further comprises two inverters for generating the delayed version of the clock signal based on the clock signal.

6. The bootstrapped switching circuit of claim 1, wherein:
   the jump start circuit comprises a switch for connecting a gate of the output transistor to a bias voltage for turning on the output transistor; and
   the switch is controlled by a control signal having a pulse to close the switch.

7. The bootstrapped switching circuit of claim 1, wherein:
   the jump start circuit comprises a sense circuit for activating the jump start circuit based on one or more conditions of the bootstrapped switching circuit indicating the startup of the positive feedback loop.

8. The bootstrapped switching circuit of claim 7, wherein the sense circuit senses a voltage representing a voltage level at a node in the bootstrapped switching circuit.

9. The bootstrapped switching circuit of claim 8, wherein the node is at a node within the positive feedback loop.

10. The bootstrapped switching circuit of claim 8, wherein the sense circuit comprises a comparator comparing the voltage against a predetermined threshold indicating the startup of the positive feedback loop.

11. The bootstrapped switching circuit of claim 1, wherein:
    the positive feedback loop comprises a boot capacitor; and
    the positive feedback loop turns on the sampling switch by bringing the gate voltage to a boosted voltage generated based on the voltage input signal and a voltage across the boot capacitor.

12. The bootstrapped switching circuit of claim 11, wherein:
    the input transistor is coupled to a first plate of the boot capacitor; and
    the output transistor is coupled to a second plate of the boot capacitor.

13. The bootstrapped switching circuit of claim 1, wherein:

the input transistor is driven by the gate voltage of the sampling switch; and the positive feedback loop further comprises a first transistor coupled to a gate of the output transistor and a drain of the input transistor, wherein the first transistor is driven by the gate voltage of the sampling switch.

14. The bootstrapped switching circuit of claim 1, wherein the positive feedback loop further comprises:
an additional transistor coupled to a gate of the output transistor and a drain of the input transistor, wherein the additional transistor is controlled by the clock signal which activates the positive feedback loop.

15. A method for accelerated turn on of a sampling switch, comprising:
outputting, by an output transistor of a positive feedback loop, an output voltage of a bootstrapped voltage generator for driving an input transistor of the positive feedback loop as positive feedback and for turning on the sampling switch;
pulling a gate voltage of the output transistor to an on-voltage level to turn on the output transistor for a period of time after the positive feedback loop is activated; and
ceasing the pulling of the gate voltage after the period of time, to release the gate voltage back to a voltage being delivered by the input transistor of the positive feedback loop, and to allow the positive feedback loop to continue turning on the sampling switch.

16. The method of claim 15, wherein:
the sampling switch receives a voltage input signal; and
the positive feedback loop receives the voltage input signal at the input transistor, and generates a boosted voltage signal based on the voltage input signal as the output voltage of the bootstrapped voltage generator to turn on the sampling switch when the positive feedback loop is engaged.

17. The method of claim 15, wherein:
pulling the gate voltage of the output transistor comprises changing the gate voltage from an off-voltage level to an on-voltage level.

18. The method of claim 15, further comprising:
after the period of time, allowing the positive feedback loop to bring the gate voltage to a voltage level of a voltage input signal provided to the bootstrapped voltage generator and the sampling switch.

19. The method of claim 15, further comprising:
sensing one or more conditions indicating the positive feedback loop has been activated; and
generating a control signal in response to sensing the one or more conditions, wherein the control signal triggers the pulling of the gate voltage of the output transistor.

20. An apparatus comprising:
sampling means receiving an input signal to be sampled and a control signal which turns the sampling means on and off;
means for generating a boosted voltage based on the input signal;
output transistor for outputting the control signal;
means for bringing the control signal to the boosted voltage through positive feedback action of the control signal; and
means for turning on the output transistor for a limited period of time at a startup of the positive feedback action, and after the limited period of time, letting the positive feedback action bring a gate voltage of the output transistor to a voltage level of the input signal.

21. The apparatus of claim 20, wherein the means for turning on the output transistor for the limited period of time comprises:
means for pulling the gate voltage of the output transistor to a low logic level for a limited period of time to turn on the output transistor.

22. The apparatus of claim 20, wherein the means for turning on the output transistor for the limited period of time comprises:
means for ceasing pulling the gate voltage of the output transistor to a low logic level after the limited period of time to let the positive feedback action bring the gate voltage of the output transistor to the voltage level of the input signal.

* * * * *

(12) INTER PARTES REVIEW CERTIFICATE (3632nd)
United States Patent
Devarajan et al.

(10) Number: US 10,250,250 K1
(45) Certificate Issued: Jul. 3, 2024

(54) BOOTSTRAPPED SWITCHING CIRCUIT

(71) Applicants: Siddharth Devarajan; Lawrence A. Singer

(72) Inventors: Siddharth Devarajan; Lawrence A. Singer

(73) Assignee: ANALOG DEVICES, INC.

Trial Number:

IPR2020-01210 filed Jul. 17, 2020

Inter Partes Review Certificate for:

Patent No.: 10,250,250
Issued: Apr. 2, 2019
Appl. No.: 15/689,491
Filed: Aug. 29, 2017

The results of IPR2020-01210 are reflected in this inter partes review certificate under 35 U.S.C. 318(b).

INTER PARTES REVIEW CERTIFICATE
U.S. Patent 10,250,250 K1
Trial No. IPR2020-01210
Certificate Issued Jul. 3, 2024

AS A RESULT OF THE INTER PARTES REVIEW PROCEEDING, IT HAS BEEN DETERMINED THAT:

Claims 1-3, 11-18 and 20-22 are cancelled.

\* \* \* \* \*